US010691608B2

(12) United States Patent
Kong

(10) Patent No.: US 10,691,608 B2
(45) Date of Patent: Jun. 23, 2020

(54) MEMORY DEVICE ACCESSED IN CONSIDERATION OF DATA LOCALITY AND ELECTRONIC SYSTEM INCLUDING THE SAME

(71) Applicant: Jaesop Kong, Gwacheon-si (KR)

(72) Inventor: Jaesop Kong, Gwacheon-si (KR)

( * ) Notice: Subject to any disclaimer, the term of this patent is extended or adjusted under 35 U.S.C. 154(b) by 231 days.

(21) Appl. No.: 15/851,775

(22) Filed: Dec. 22, 2017

(65) Prior Publication Data

US 2018/0314640 A1 Nov. 1, 2018

(30) Foreign Application Priority Data

Apr. 27, 2017 (KR) ........................ 10-2017-0054680

(51) Int. Cl.
*G06F 12/08* (2016.01)
*G06F 12/0882* (2016.01)
(Continued)

(52) U.S. Cl.
CPC ........ *G06F 12/0882* (2013.01); *G06F 3/0611* (2013.01); *G06F 3/0656* (2013.01); *G06F 3/0658* (2013.01); *G06F 3/0673* (2013.01); *G06F 12/0207* (2013.01); *G06F 12/1063* (2013.01); *G06F 13/16* (2013.01);
(Continued)

(58) Field of Classification Search
CPC .. G06F 12/0882; G06F 3/0673; G06F 3/0658; G06F 3/0656; G06F 3/0611; G06F 2212/1024; G06F 2212/455; G06F 13/16; G06F 12/1063; G06F 12/0207; G06F 2212/1028; G11C 7/12; G11C 8/12; G11C 8/10; G11C 7/1012; G11C 2207/2209; G11C 2207/005; G11C 7/1018
See application file for complete search history.

(56) References Cited

U.S. PATENT DOCUMENTS 7,009,893 B2 3/2006 Choi et al.
9,658,953 B2 * 5/2017 Sheffler .................... G11C 7/22
(Continued)

FOREIGN PATENT DOCUMENTS

JP 2013089276 5/2013
KR 20040048051 6/2004

*Primary Examiner* — Ajay Ojha
(74) *Attorney, Agent, or Firm* — Daly Crowley Mofford & Durkee, LLP

(57) ABSTRACT

A memory device includes a memory cell array, a row decoder, a multi-column decoder, a gating circuit, and an input/output data driving circuit. The memory cell array includes a plurality of memory cells arranged to form a plurality of rows and a plurality of columns. The row decoder generates a row selection signal based on a row address to select a target row from the rows. The multi-column decoder generates a multi-column selection signal based on a column address and column selection information to select a plurality of target columns from columns included in the target row at a time. The gating circuit selects the target columns at a time based on the multi-column selection signal. The input/output data driving circuit writes input data to the target columns at a time or outputs data stored in the target columns at a time as output data through the gating circuit based on the multi-column selection signal and a data mask signal. Column addresses corresponding to the target columns included in the target row are not consecutive.

21 Claims, 27 Drawing Sheets

650a

(51) Int. Cl.

| | |
|---|---|
| ***G06F 3/06*** | (2006.01) |
| ***G11C 8/10*** | (2006.01) |
| ***G11C 8/12*** | (2006.01) |
| ***G11C 7/12*** | (2006.01) |
| ***G11C 7/10*** | (2006.01) |
| ***G06F 13/16*** | (2006.01) |
| ***G06F 12/1045*** | (2016.01) |
| ***G06F 12/02*** | (2006.01) |

(52) U.S. Cl.
CPC .............. *G11C 7/1012* (2013.01); *G11C 7/12* (2013.01); *G11C 8/10* (2013.01); *G11C 8/12* (2013.01); *G06F 2212/1024* (2013.01); *G06F 2212/1028* (2013.01); *G06F 2212/455* (2013.01); *G11C 7/1018* (2013.01); *G11C 2207/005* (2013.01); *G11C 2207/2209* (2013.01)

(56) References Cited

U.S. PATENT DOCUMENTS

| | | | | |
|---|---|---|---|---|
| 10,388,348 | B2 * | 8/2019 | Shimizu | G11C 11/1653 |
| 2006/0072366 | A1 * | 4/2006 | Ware | G11C 8/12 365/230.06 |
| 2009/0067277 | A1 * | 3/2009 | Smith | G11C 7/1066 365/230.06 |

* cited by examiner

| w00 | w01 | w02 | w03 | w10 | w11 | w12 | w13 | w20 | w21 | w22 | w23 | w30 | w31 | w32 | w33 | w40 | w41 | w42 | w43 |
|---|---|---|---|---|---|---|---|---|---|---|---|---|---|---|---|---|---|---|---|
| w04 | w05 | w06 | w07 | w14 | w15 | w16 | w17 | w24 | w25 | w26 | w27 | w34 | w35 | w36 | w37 | w44 | w45 | w46 | w47 |
| w08 | w09 | w0a | w0b | w18 | w19 | w1a | w1b | w28 | w29 | w2a | w2b | w38 | w39 | w3a | w3b | w48 | w49 | w4a | w4b |
| w0c | w0d | w0e | w0f | w1c | w1d | w1e | w1f | w2c | w2d | w2e | w2f | w3c | w3d | w3e | w3f | w4c | w4d | w4e | w4f |
| w50 | w51 | w52 | w53 | w60 | w61 | w62 | w63 | w70 | w71 | w72 | w73 | w80 | w81 | w82 | w83 | w90 | w91 | w92 | w93 |
| w54 | w55 | w56 | w57 | w64 | w65 | w66 | w67 | w74 | w75 | w76 | w77 | w84 | w85 | w86 | w87 | w94 | w95 | w96 | w97 |
| w58 | w59 | w5a | w5b | w68 | w69 | w6a | w6b | w78 | w79 | w7a | w7b | w88 | w89 | w8a | w8b | w98 | w99 | w9a | w9b |
| w5c | w5d | w5e | w5f | w6c | w6d | w6e | w6f | w7c | w7d | w7e | w7f | w8c | w8d | w8e | w8f | w9c | w9d | w9e | w9f |

FIG. 3B

| | | | | | | | | | | | | | | | | | |
|---|---|---|---|---|---|---|---|---|---|---|---|---|---|---|---|---|---|
| w00 | w01 | w02 | w03 | w04 | w05 | w06 | w07 | w08 | w09 | w0a | w0b | w0c | w0d | w0e | w0f | w10 | w11 |
| w12 | w13 | w14 | w15 | w16 | w17 | w18 | w19 | w1a | w1b | w1c | w1d | w1e | w1f | w20 | w21 | w22 | w23 |
| w24 | w25 | w26 | w27 | w28 | w29 | w2a | w2b | w2c | w2d | w2e | w2f | w30 | w31 | w32 | w33 | w34 | w35 |
| w36 | w37 | w38 | w39 | w3a | w3b | w3c | w3d | w3e | w3f | w40 | w41 | w42 | w43 | w44 | w45 | w46 | w47 |
| w48 | w49 | w4a | w4b | w4c | w4d | w4e | w4f | w50 | w51 | w52 | w53 | w54 | w55 | w56 | w57 | w58 | w59 |
| w5a | w5b | w5c | w5d | w5e | w5f | w60 | w61 | w62 | w63 | w64 | w65 | w66 | w67 | w68 | w69 | w6a | w6b |

FIG. 3C

| | | | | | | | | | | | | | | | | | | | |
|---|---|---|---|---|---|---|---|---|---|---|---|---|---|---|---|---|---|---|---|
| w00 | w01 | w02 | w03 | w04 | w05 | w06 | w07 | w08 | w09 | w0a | w0b | w0c | w0d | w0e | w0f | w10 | w11 | ~~w12~~ | ~~w13~~ |
| w14 | w15 | w16 | w17 | w18 | w19 | w1a | w1b | w1c | w1d | w1e | w1f | w20 | w21 | w22 | w23 | w24 | w25 | ~~w26~~ | ~~w27~~ |
| w28 | w29 | w2a | w2b | w2c | w2d | w2e | w2f | w30 | w31 | w32 | w33 | w34 | w35 | w36 | w37 | w38 | w39 | ~~w3a~~ | ~~w3b~~ |
| w3c | w3d | w3e | w3f | w40 | w41 | w42 | w43 | w44 | w45 | w46 | w47 | w48 | w49 | w4a | w4b | w4c | w4d | ~~w4e~~ | ~~w4f~~ |
| w50 | w51 | w52 | w53 | w54 | w55 | w56 | w57 | w58 | w59 | w5a | w5b | w5c | w5d | w5e | w5f | w60 | w61 | ~~w62~~ | ~~w63~~ |
| w64 | w65 | w66 | w67 | w68 | w69 | w6a | w6b | w6c | w6d | w6e | w6f | w70 | w71 | w72 | w73 | w74 | w75 | ~~w76~~ | ~~w77~~ |

| w00 | w01 | w02 | w03 | w04 | w05 | w06 | w07 | w20 | w21 | w22 | w23 | w24 | w25 | w26 | w27 | w40 | w41 | w42 | w43 |
|-----|-----|-----|-----|-----|-----|-----|-----|-----|-----|-----|-----|-----|-----|-----|-----|-----|-----|-----|-----|
| w08 | w09 | w0a | w0b | w0c | w0d | w0e | w0f | w28 | w29 | w2a | w2b | w2c | w2d | w2e | w2f | w48 | w49 | w4a | w4b |
| w10 | w11 | w12 | w13 | w14 | w15 | w16 | w17 | w30 | w31 | w32 | w33 | w34 | w35 | w36 | w37 | w50 | w51 | w52 | w53 |
| w18 | w19 | w1a | w1b | w1c | w1d | w1e | w1f | w38 | w39 | w3a | w3b | w3c | w3d | w3e | w3f | w58 | w59 | w5a | w5b |
| w44 | w45 | w46 | w47 | w60 | w61 | w62 | w63 | w64 | w65 | w66 | w67 | w80 | w81 | w82 | w83 | w84 | w85 | w86 | w87 |
| w54 | w55 | w56 | w57 | w68 | w69 | w6a | w6b | w6c | w6d | w6e | w6f | w88 | w89 | w8a | w8b | w8c | w8d | w8e | w8f |
| w54 | w55 | w56 | w57 | w70 | w71 | w72 | w73 | w74 | w75 | w76 | w77 | w90 | w91 | w92 | w93 | w94 | w95 | w96 | w97 |
| w5c | w5d | w5e | w5f | w78 | w79 | w7a | w7b | w7c | w7d | w7e | w7f | w98 | w99 | w9a | w9b | w9c | w9d | w9e | w9f |

FIG. 4A

| p00 | p01 | p02 | p03 | p10 | p11 | p12 | p13 | p20 | p21 | p22 | p23 | p30 | p31 | p32 | p33 | p40 | p41 |
|---|---|---|---|---|---|---|---|---|---|---|---|---|---|---|---|---|---|
| p04 | p05 | p06 | p07 | p14 | p15 | p16 | p17 | p24 | p25 | p26 | p27 | p34 | p35 | p36 | p37 | p44 | p45 |
| p08 | p09 | p0a | p0b | p18 | p19 | p1a | p1b | p28 | p29 | p2a | p2b | p38 | p39 | p3a | p3b | p48 | p49 |
| p0c | p0d | p0e | p0f | p1c | p1d | p1e | p1f | p2c | p2d | p2e | p2f | p3c | p3d | p3e | p3f | p4c | p4d |
| p50 | p51 | p52 | p53 | p60 | p61 | p62 | p63 | p70 | p71 | p72 | p73 | p80 | p81 | p82 | p83 | p90 | p91 |
| p54 | p55 | p56 | p57 | p64 | p65 | p66 | p67 | p74 | p75 | p76 | p77 | p84 | p85 | p86 | p87 | p94 | p95 |

FIG. 4B

| | | | | | |
|---|---|---|---|---|---|
| ~~p54~~ | ~~p50~~ | ~~p0c~~ | ~~p08~~ | ~~p04~~ | ~~p00~~ |
| ~~p55~~ | ~~p51~~ | ~~p0d~~ | ~~p09~~ | ~~p05~~ | ~~p01~~ |
| p56 | p52 | p0e | p0a | p06 | p02 |
| p57 | p53 | p0f | p0b | p07 | p03 |
| p64 | p60 | p1c | p18 | p14 | p10 |
| p65 | p61 | p1d | p19 | p15 | p11 |
| p66 | p62 | p1e | p1a | p16 | p12 |
| p67 | p63 | p1f | p1b | p17 | p13 |
| p74 | p70 | p2c | p28 | p24 | p20 |
| p75 | p71 | p2d | p29 | p25 | p21 |
| p76 | p72 | p2e | p2a | p26 | p22 |
| p77 | p73 | p2f | p2b | p27 | p23 |
| p84 | p80 | p3c | p38 | p34 | p30 |
| p85 | p81 | p3d | p39 | p35 | p31 |
| p86 | p82 | p3e | p3a | p36 | p32 |
| p87 | p83 | p3f | p3b | p37 | p33 |
| p94 | p90 | p4c | p48 | p44 | p40 |
| p95 | p91 | p4d | p49 | p45 | p41 |

| p00 | p01 | p02 | p03 | p04 | p05 | p06 | p07 | p08 | p09 | p0a | p0b | p0c | p0d | p0e | p0f |
| p10 | p11 | p12 | p13 | p14 | p15 | p16 | p17 | p18 | p19 | p1a | p1b | p1c | p1d | p1e | p1f |
| p20 | p21 | p22 | p23 | p24 | p25 | p26 | p27 | p28 | p29 | p2a | p2b | p2c | p2d | p2e | p2f |
| p30 | p31 | p32 | p33 | p34 | p35 | p36 | p37 | p38 | p39 | p3a | p3b | p3c | p3d | p3e | p3f |
| p40 | p41 | p42 | p43 | p44 | p45 | p46 | p47 | p48 | p49 | p4a | p4b | p4c | p4d | p4e | p4f |
| p50 | p51 | p52 | p53 | p54 | p55 | p56 | p57 | p58 | p59 | p5a | p5b | p5c | p5d | p5e | p5f |
| p60 | p61 | p62 | p63 | p64 | p65 | p66 | p67 | p68 | p69 | p6a | p6b | p6c | p6d | p6e | p6f |
| p70 | p71 | p72 | p73 | p74 | p75 | p76 | p77 | p78 | p79 | p7a | p7b | p7c | p7d | p7e | p7f |
| p80 | p81 | p82 | p83 | p84 | p85 | p86 | p87 | p88 | p89 | p8a | p8b | p8c | p8d | p8e | p8f |
| p90 | p91 | p92 | p93 | p94 | p95 | p96 | p97 | p98 | p99 | p9a | p9b | p9c | p9d | p9e | p9f |

FIG. 5B

| | | | | | | | | | | | | | | | |
|---|---|---|---|---|---|---|---|---|---|---|---|---|---|---|---|
| **p00** | **p01** | **p02** | **p03** | **p10** | **p11** | **p12** | **p13** | **p20** | **p21** | **p22** | **p23** | **p30** | **p31** | **p32** | **p33** |
| **p40** | **p41** | p04 | p05 | p06 | p07 | p14 | p15 | p16 | p17 | p24 | p25 | p26 | p27 | p34 | p35 |
| p36 | p37 | p44 | p45 | p08 | p09 | p0a | p0b | p18 | p19 | p1a | p1b | p28 | p29 | p2a | p2b |
| p38 | p39 | p3a | p3b | p48 | p49 | p0c | p0d | p0e | p0f | p1c | p1d | p1e | p1f | p2c | p2d |
| p2e | p2f | p3c | p3d | p3e | p3f | p4c | p4d | p50 | p51 | p52 | p53 | p60 | p61 | p62 | p63 |
| p70 | p71 | p72 | p73 | p80 | p81 | p82 | p83 | p90 | p91 | p54 | p55 | p56 | p57 | p64 | p65 |
| p66 | p67 | p74 | p75 | p76 | p77 | p84 | p85 | p86 | p87 | p94 | p95 | | | | |

FIG. 5C

| | | | | | | | | | | | | | | | |
|---|---|---|---|---|---|---|---|---|---|---|---|---|---|---|---|
| p00 | p01 | p02 | p03 | p10 | p11 | p12 | p13 | p20 | p21 | p22 | p23 | p30 | p31 | p32 | p33 |
| p40 | p41 | p42 | p43 | p04 | p05 | p06 | p07 | p14 | p15 | p16 | p17 | p24 | p25 | p26 | p27 |
| p34 | p35 | p36 | p37 | p44 | p45 | p46 | p47 | p08 | p09 | p0a | p0b | p18 | p19 | p1a | p1b |
| p28 | p29 | p2a | p2b | p38 | p39 | p3a | p3b | p48 | p49 | p4a | p4b | p0c | p0d | p0e | p0f |
| p1c | p1d | p1e | p1f | p2c | p2d | p2e | p2f | p3c | p3d | p3e | p3f | p4c | p4d | p4e | p4f |
| p50 | p51 | p52 | p53 | p60 | p61 | p62 | p63 | p70 | p71 | p72 | p73 | p80 | p81 | p82 | p83 |
| p90 | p91 | p92 | p93 | p54 | p55 | p56 | p57 | p64 | p65 | p66 | p67 | p74 | p75 | p76 | p77 |
| p84 | p85 | p86 | p87 | p94 | p95 | p96 | p97 | | | | | | | | |

| | 0 | 1 | 2 | 3 | 4 | 5 | 6 | 7 | 8 | 9 | a | b | c | d | e | f |
|---|---|---|---|---|---|---|---|---|---|---|---|---|---|---|---|---|
| p0 | p00 | p01 | p02 | p03 | p04 | p05 | p06 | p07 | p08 | p09 | p0a | p0b | p0c | p0d | p0e | p0f |
| p1 | p10 | p11 | p12 | p13 | p14 | p15 | p16 | p17 | p18 | p19 | p1a | p1b | p1c | p1d | p1e | p1f |
| p2 | p20 | p21 | p22 | p23 | p24 | p25 | p26 | p27 | p28 | p29 | p2a | p2b | p2c | p2d | p2e | p2f |
| p3 | p30 | p31 | p32 | p33 | p34 | p35 | p36 | p37 | p38 | p39 | p3a | p3b | p3c | p3d | p3e | p3f |
| p4 | p40 | p41 | p42 | p43 | p44 | p45 | p46 | p47 | p48 | p49 | p4a | p4b | p4c | p4d | p4e | p4f |
| p5 | p50 | p51 | p52 | p53 | p54 | p55 | p56 | p57 | p58 | p59 | p5a | p5b | p5c | p5d | p5e | p5f |
| p6 | p60 | p61 | p62 | p63 | p64 | p65 | p66 | p67 | p68 | p69 | p6a | p6b | p6c | p6d | p6e | p6f |
| p7 | p70 | p71 | p72 | p73 | p74 | p75 | p76 | p77 | p78 | p79 | p7a | p7b | p7c | p7d | p7e | p7f |
| p8 | p80 | p81 | p82 | p83 | p84 | p85 | p86 | p87 | p88 | p89 | p8a | p8b | p8c | p8d | p8e | p8f |
| p9 | p90 | p91 | p92 | p93 | p94 | p95 | p96 | p97 | p98 | p99 | p9a | p9b | p9c | p9d | p9e | p9f |

FIG. 5E

| | | | | | | | | | | | | | | | |
|---|---|---|---|---|---|---|---|---|---|---|---|---|---|---|---|
| p00 | p01 | p02 | p03 | p04 | p05 | p06 | p07 | p08 | p09 | p0a | p0b | p0c | p0d | p0e | p0f |
| p10 | p11 | p12 | p13 | p14 | p15 | p16 | p17 | p18 | p19 | p1a | p1b | p1c | p1d | p1e | p1f |
| p20 | p21 | p22 | p23 | p24 | p25 | p26 | p27 | p28 | p29 | p2a | p2b | p2c | p2d | p2e | p2f |
| p30 | p31 | p32 | p33 | p34 | p35 | p36 | p37 | p38 | p39 | p3a | p3b | p3c | p3d | p3e | p3f |
| p40 | p41 | p42 | p43 | p44 | p45 | p46 | p47 | p48 | p49 | p4a | p4b | p4c | p4d | p4e | p4f |
| p50 | p51 | p52 | p53 | p54 | p55 | p56 | p57 | p58 | p59 | p5a | p5b | p5c | p5d | p5e | p5e |
| p60 | p61 | p62 | p63 | p64 | p65 | p66 | p67 | p68 | p69 | p6a | p6b | p6c | p6d | p6e | p6f |
| p70 | p71 | p72 | p73 | p74 | p75 | p76 | p77 | p78 | p79 | p7a | p7b | p7c | p7d | p7e | p7f |
| p80 | p81 | p82 | p83 | p84 | p85 | p86 | p87 | p88 | p89 | p8a | p8b | p8c | p8d | p8e | p8f |
| p90 | p91 | p92 | p93 | p94 | p95 | p96 | p97 | p98 | p99 | p9a | p9b | p9c | p9d | p9e | p9f |

FIG. 6

| column | c00 | c01 | c02 | c03 | c04 | c05 | c06 | c07 | c08 | c09 | c0a | c0b | c0c | c0d | c0e | c0f |
|---|---|---|---|---|---|---|---|---|---|---|---|---|---|---|---|---|
| mode 00 | O | O | O | O | O | O | O | O | | | | | | | | |
| | | | | | | | | | O | O | O | O | O | O | O | O |
| mode 10 | O | O | O | O | | | | | O | O | O | O | | | | |
| | | | | | O | O | O | O | | | | | O | O | O | O |
| mode 11 | O | O | | | O | O | | | O | O | | | O | O | | |
| | | | O | O | | | O | O | | | O | O | | | O | O |

MEMORY DEVICE ACCESSED IN CONSIDERATION OF DATA LOCALITY AND ELECTRONIC SYSTEM INCLUDING THE SAME

CROSS-REFERENCE TO RELATED APPLICATION

This application claims priority under 35 USC § 119 to Korean Patent Application No. 10-2017-0054680 filed on Apr. 27, 2017 in the Korean Intellectual Property Office (KIPO), the entire disclosure of which is incorporated herein by reference.

BACKGROUND

1. Field

Example embodiments relate generally to memory devices, and more particularly to memory devices capable of storing and accessing multi-dimensional array data having locality and electronic systems including the memory devices.

2. Description of the Related Art

Multimedia data shows a high correlation between spatiotemporally close pixel data, so that a relatively strong data locality occurs when the data is processed. For example, when processing image data obtained from a camera sensor, adjacent pixel data of the same frame or previous/next frames is frequently required.

A raster scheme and a tile scheme are typical schemes of mapping a memory address to each pixel position to store the multimedia data in a memory device. In the raster scheme, pixel data in the direction of a horizontal scanning line within one frame is sequentially stored in memory cells while increasing the memory address. In the tile scheme, one frame is divided into a plurality of tiles, and pixel data of one tile is sequentially stored in the memory cells such that memory addresses are adjacent to each other. In the process of generating, processing, and consuming the multimedia data, the raster scheme and the tile scheme can be appropriately selected so that the pixel data can be written to/read from cells having consecutive memory addresses for high-performance and low-power operation. At this time, a conventional memory device may be ineffective in the process of switching between the raster scheme and the tile scheme.

Generally, in the conventional memory device, the inefficiency occurs in terms of performance or power consumption if the memory device is not accessed according to the consecutive memory addresses. Therefore, it is difficult to efficiently cope with the multi-dimensional locality occurring when processing multi-dimensional array data by one memory mapping scheme, and additional costs are required to switch the memory mapping scheme.

FIG. 1 is a block diagram illustrating a conventional memory device including a row decoder and a column decoder to access cells at a specific memory address.

Referring to FIG. 1, a memory device 10 includes a memory cell array 20, a row decoder 30, a column decoder 40, a gating circuit 50, and an input/output data driving circuit 60.

The memory cell array 20 includes a plurality of memory cells arranged to form a plurality of rows and a plurality of columns. As the capacity of the memory device 10 increases, a method of two-dimensionally arranging memory cells and selectively writing/reading data to/from desired cells through the row decoder 30 and the column decoder 40 is being adopted.

To access a target memory cell, the row decoder 30 generates a row selection signal RSEL0 based on a row address RADDR0 to select a row R0 including the target memory cell. The memory cells included in the selected row R0 are connected to the gating circuit 50. One row (e.g., R0) of the memory cell array 20 constitutes one page. The gating circuit 50 may include a sense amplifier to sense the memory cells and stably process signals.

The column decoder 40 generates a column selection signal CSEL0 based on a column address CADDR0 to select a column C0 (hatched portion) including the target memory cell in the selected row R0. The memory cells included in the selected column C0 of the selected row R0 are connected to the input/output data driving circuit 60 through the gating circuit 50. Accordingly, the target memory cell included in the selected column C0 can be accessed.

The input/output data driving circuit 60 includes an input data driving circuit and an output data driving circuit. Input data received by the input data driving circuit is written to the selected column C0 of the selected row R0 through the gating circuit 50. At this time, undesired input data is prevented from being written to the memory cell array 20 based on a data mask signal DMSO. Data stored in the selected column C0 of the selected row R0 is transmitted to the output data driving circuit through the gating circuit 50 and provided as output data. If a size of the column C0 is smaller than a size of the input/output data, columns having column addresses adjacent to a column address of the column C0 are sequentially accessed in addition to the column C0, such that a sum of the sizes of the accessed columns matches with the size of the input/output data, and then writing or reading is performed.

In the conventional memory device 10, only memory cells having consecutive addresses selected by the row decoder 30 and the column decoder 40 are accessed at a time. Therefore, even when memory cells in the same row or the same page are accessed, if the addresses of the target memory cells are not consecutive, inefficiency may occur where the target memory cells are not accessed at a time or unnecessary memory cells are accessed together.

SUMMARY

Some example embodiments provide a memory device capable of accessing inconsecutive memory cells at a time to improve efficiency of data write/read operations.

Further, some example embodiments provide an electronic system including a memory device capable of accessing inconsecutive memory cells at a time.

According to example embodiments, a memory device includes a memory cell array, a row decoder, a multi-column decoder, a gating circuit, and an input/output data driving circuit. The memory cell array includes a plurality of memory cells arranged to form a plurality of rows and a plurality of columns. The row decoder generates a row selection signal based on a row address to select a target row from the plurality of rows. The multi-column decoder generates a multi-column selection signal based on a column address and column selection information to select a plurality of target columns from columns included in the target row at a time. The gating circuit selects the plurality of target columns at a time based on the multi-column selection signal. The input/output data driving circuit writes input data to the plurality of target columns at a time or outputs data stored in the plurality of target columns at a time as output data through the gating circuit based on the multi-column selection signal and a data mask signal. Column addresses corresponding to the plurality of target columns included in the target row are not consecutive.

In an example embodiment, the memory device may further include a line decoder and a second gating circuit. The line decoder may generate a line selection signal based on the column address to select one target line from a plurality of lines included in the target row, in which each of the plurality of lines includes at least two columns. The second gating circuit may select the one target line based on the line selection signal. The plurality of target columns may be included in the one target line.

In an example embodiment, data stored in the target row may include data mapped in a tile scheme or a super tile scheme where $2^n$ tiles (n is a positive integer) are serially connected.

In an example embodiment, the column selection information may be set based on a predefined column selection mode. An available combination of the plurality of target columns included in the target row may match with the column selection mode.

In an example embodiment, data stored in the target row may include array data mapped in a tile scheme. The column selection information may be set based on a column selection parameter. The column selection parameter may include information of positions of two element data included in one tile, and the plurality of target columns may correspond to elements in one side with respect to a virtual line that passes through the two element positions.

In an example embodiment, data stored in the target row may include array data mapped in a tile scheme. The column selection information may be set based on a column selection parameter. The column selection parameter may include information of positions of two element data included in one tile, and the plurality of target columns may correspond to elements within a virtual rectangle that has diagonal vertices at the two element positions.

In an example embodiment, the column selection information may be provided in a form of a column selection list that directly includes information on the plurality of target columns.

In an example embodiment, the column selection information may be set based on predefined column selection modes, and provided in a form of a column selection information list where the column selection modes are combined.

In one aspect, a memory device according to some example embodiments includes a first memory device, a multi-column decoder, a gating circuit, and an input/output data driving circuit. The first memory device includes a plurality of memory cells arranged to form a plurality of rows and a plurality of columns, selects a target row from the plurality of rows based on a row address, and selects a target line from a plurality of lines included in the target row based on a column address, in which each of the plurality of lines includes at least two columns. The multi-column decoder generates a multi-column selection signal based on the column address and column selection information to select a plurality of target columns from columns included in the target line at a time. The gating circuit selects the plurality of target columns in the target line at a time based on the multi-column selection signal. The input/output data driving circuit writes input data to the plurality of target columns at a time; or outputs data stored in the plurality of target columns at a time as output data through the gating circuit based on the multi-column selection signal and a data mask signal. Column addresses corresponding to the plurality of target columns included in the target line are not consecutive. The input/output data driving circuit generates an enhanced data mask signal based on the data mask signal and the multi-column selection signal. The first memory device prevents the input data from being written to an unselected column other than the plurality of target columns in the target line based on the enhanced data mask signal.

In an example embodiment, data stored in the target row may include data mapped in a tile scheme or a super tile scheme where $2^n$ tiles (n is a positive integer) are serially connected.

In an example embodiment, the column selection information may be set based on a predefined column selection mode. An available combination of the plurality of target columns included in the target row may match with the column selection mode.

In an example embodiment, data stored in the target row may include array data mapped in a tile scheme. The column selection information may be set based on a column selection parameter. The column selection parameter may include information of positions of two element data included in one tile, and the plurality of target columns may correspond to elements in one side with respect to a virtual line that passes through the two element positions.

In an example embodiment, data stored in the target row may include array data mapped in a tile scheme. The column selection information may be set based on a column selection parameter. The column selection parameter may include information of positions of two element data included in one tile, and the plurality of target columns may correspond to elements within a virtual rectangle that has diagonal vertices at the two element positions.

In an example embodiment, the column selection information may be provided in a form of a column selection list that directly includes information on the plurality of target columns.

In an example embodiment, the column selection information may be set based on predefined column selection modes, and provided in a form of a column selection information list where the column selection modes are combined.

In another aspect, an electronic system according to some example embodiments includes a memory device and a bus master. The memory device includes a plurality of memory cells arranged to form a plurality of rows and a plurality of columns, generates a row selection signal based on a row address to select a target row from the rows, generates a multi-column selection signal based on a column address and column selection information to select a plurality of target columns from columns included in the target row at a time, selects the plurality of target columns at a time based on the multi-column selection signal, and writes input data to the plurality of target columns at a time or outputs data stored in the plurality of target columns at a time as output data based on the multi-column selection signal and a data mask signal, in which column addresses corresponding to the plurality of target columns included in the target row are not consecutive. The bus master is connected to the memory device through a bus, and generates the row address, the column address, and the column selection information provided to the memory device. The bus master includes a controller that includes a memory management unit and a column selection information generator. The memory management unit generates the row address and the column address corresponding to a physical address based on a virtual address and memory mapping information. The column selection information generator generates the column selection information based on the memory mapping information, memory access type information, and default memory access type information.

In an example embodiment, the memory mapping information and the default memory access type information may be stored in a separate register or a page table.

In an example embodiment, the column selection information generator may generate the column selection information based on the memory mapping information and the memory access type information when the memory access type information is valid, and may generate the column selection information based on the memory mapping information and the default memory access type information when the memory access type information is invalid.

In an example embodiment, the bus master may include a first comparator, a selector, a second comparator, a logic gate, a cache controller, and a cache memory. The first comparator may compare a tag of the virtual address or the physical address with a tag stored in a cache entry to generate a first comparison signal. The selector may select one of the memory access type information and the default memory access type information. The second comparator may compare an output of the selector with memory access type information stored in an auxiliary bit of the cache entry to generate a second comparison signal. The logic gate may generate a cache hit result signal based on validity of the first comparison signal, the second comparison signal, and a valid bit of a flag bit stored in the cache entry. The cache controller may increase an offset in an order of memory access types, store data in a cache line of the cache entry, and store the memory access types and the column selection information in the auxiliary bit of the cache entry. The cache memory may be controlled by the cache controller, and may include the auxiliary bit in the cache entry.

In an example embodiment, the bus master may further include a cache controller and a cache memory. The cache controller may access a plurality of target cache columns among a plurality of cache columns of a cache line at a time based on the column selection information. The cache memory may be controlled by the cache controller to write the input data to the plurality of target cache columns at a time, or to output data stored in the plurality of target cache columns as the output data at a time.

In an example embodiment, the cache controller may include a distributor distributing the column selection information. The plurality of target cache columns among the plurality of cache columns included in the cache line may be accessed at a time based on the distributed column selection information outputted from the distributor.

The memory device according to example embodiments can be implemented by including a multi-column decoder, and can access a plurality of target columns at a time based on a column selection signal. Therefore, in the case of processing multi-dimensional array data having a relatively strong locality, such as multimedia data and matrix data, a plurality of target columns can be accessed at a time, so that the data in the memory device can be accessed with additional degrees of freedom, thereby improving performance and efficiency of the memory device and the electronic system including the same.

BRIEF DESCRIPTION OF THE DRAWINGS

Illustrative, non-limiting example embodiments will be more clearly understood from the following detailed description taken in conjunction with the accompanying drawings.

FIGS. 3A, 3B, 3C, 3D, 4A, 4B, 5A, 5B, 5C, 5D, and 5E are diagrams to describe an operation of the memory device according to example embodiments.

FIGS. 6, 7A, 7B, 7C, 8A, and 8B are diagrams to describe a configuration of column selection information used in the memory device according to example embodiments.

DETAILED DESCRIPTION OF THE EMBODIMENTS

Figure 1:
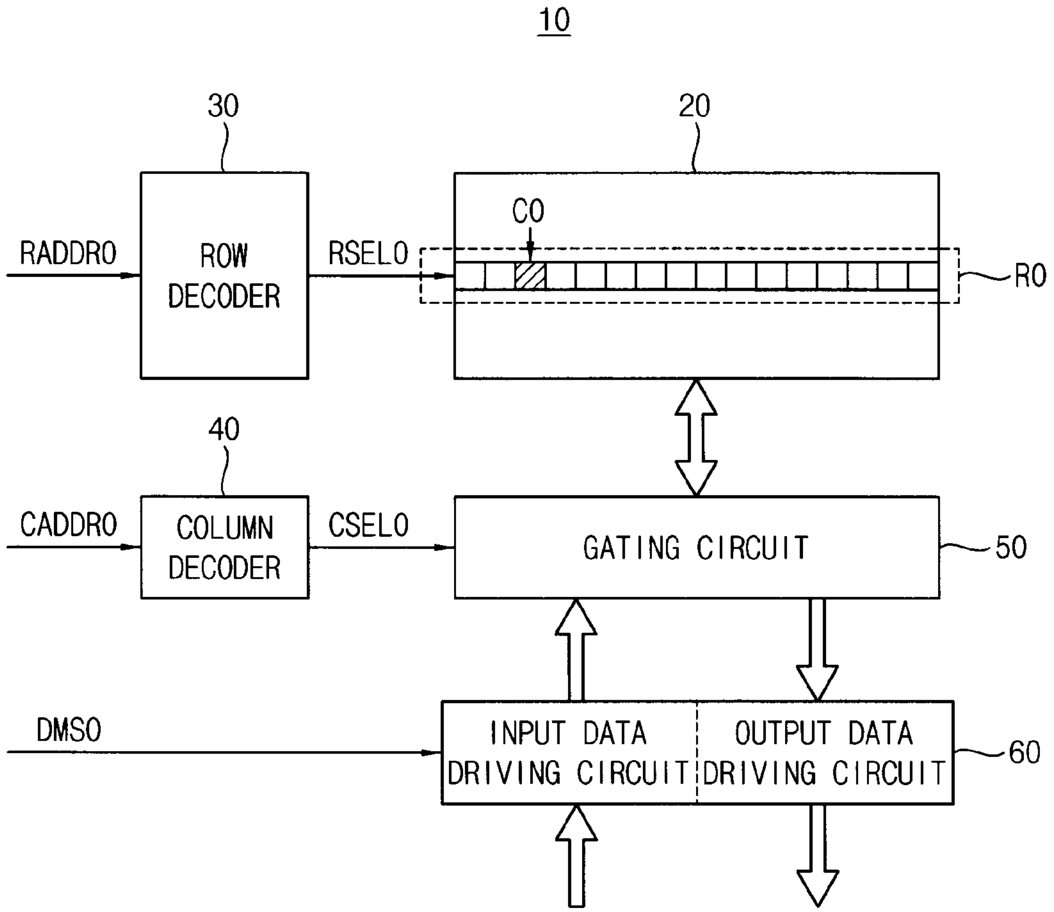
FIG. 1 is a block diagram illustrating a conventional memory device including a row decoder and a column decoder to access cells at a specific memory address.

Referring to example embodiments described herein, specific structural and functional descriptions are made for illustrative purposes. The example embodiments may be implemented in various forms, and the present inventive concept should not be construed as being limited to the example embodiments described herein.

The present inventive concept may be embodied in many different forms, and should not be construed as being limited to the example embodiments set forth herein and shown in accompanying drawings. It should be understood that all modification, equivalents, or alternatives of these embodiments are included within the scope of the present inventive concept.

It will be understood that, although the terms first, second, etc. may be used herein to describe various elements, the elements should not be limited by the terms. The terms can be used to distinguish one element from another element. Thus, a first element could be termed a second element, and the second element could be termed the first element without departing from the teachings of the present inventive concept.

It will be understood that when an element is referred to as being "connected" to another element, the element may be directly connected to another element, or intervening elements may be present. Other expressions describing the relation between the elements will be interpreted in the same manner.

The terminology used herein is for the purpose of describing particular example embodiments only and is not intended to be limiting of the present inventive concept. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, it should also be noted that in some alternative implementations, the functions/acts noted in the blocks may occur out of the order as noted in the flowcharts. For example, two blocks shown in succession may in fact be executed substantially concurrently or the blocks may sometimes be executed in the reverse order, depending upon the functionality/acts involved.

In the present disclosure, when cells or columns of a memory device are expressed as “consecutive,” it does not mean that physical locations of the cells or columns are consecutive, but means that addresses of the corresponding cells or columns are consecutive.

In the present disclosure, the expression “at a time” is used for a series of actions to perform one command or request. For example, burst mode memory access is not performed simultaneously, but is performed at a time.

In the present disclosure, multimedia data will only refer to position information in the multi-dimensional array of the multimedia data, so that the multimedia data can be described as general multi-dimensional array data. Pixels in a screen correspond to elements in an array.

Hereinafter, example embodiments will be described in detail with reference to the accompanying drawings. The same reference numerals will be assigned to the same elements in the drawings, and redundant descriptions for the same elements will be omitted.

Figure 2A:
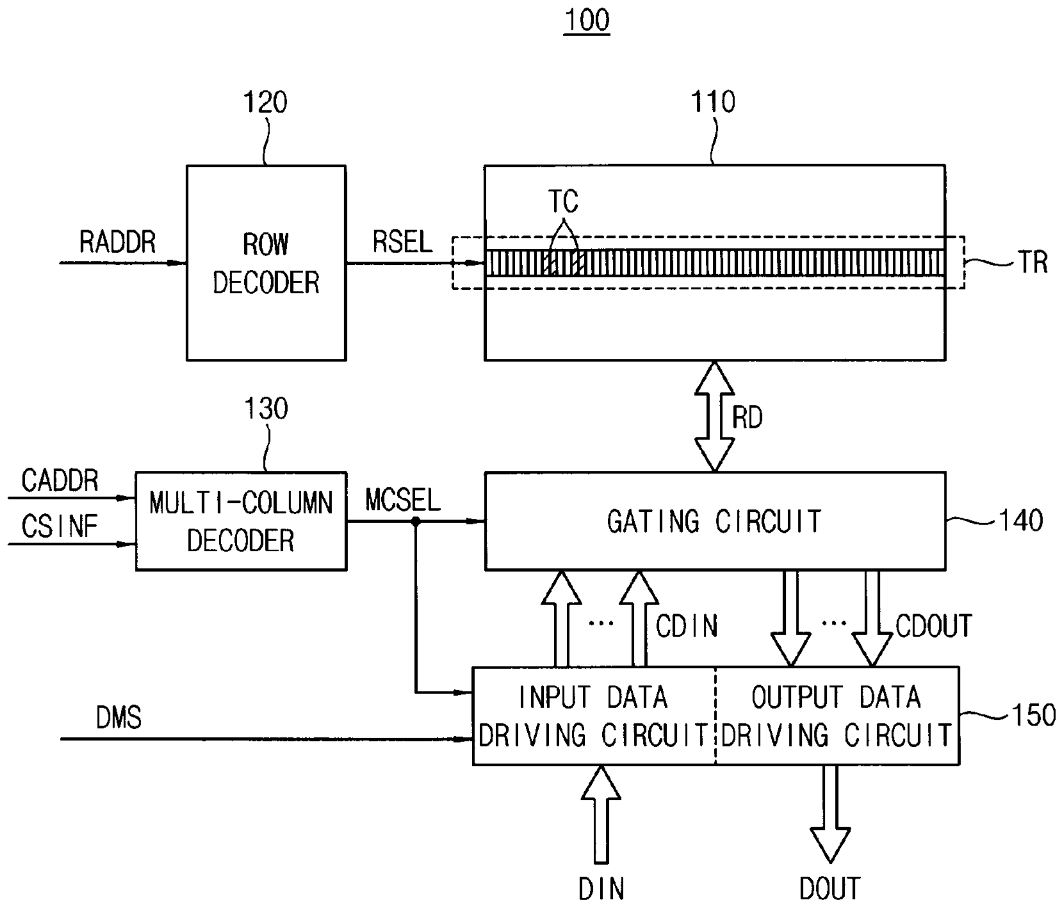
FIGS. 2A, 2B, and 2C are block diagrams illustrating a memory device accessing inconsecutive memory cells at a time according to example embodiments.
Figure 2B:
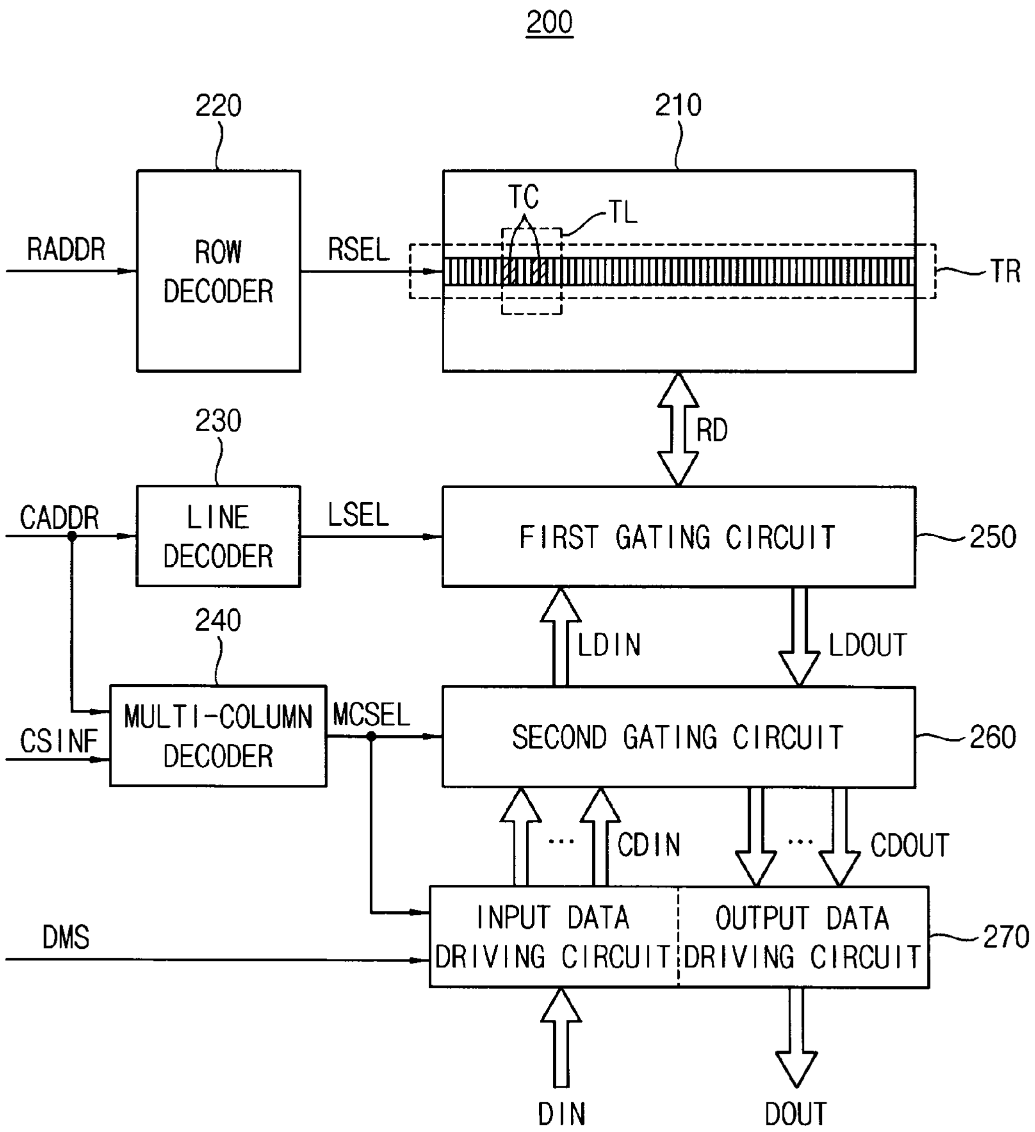
Figure 2C:
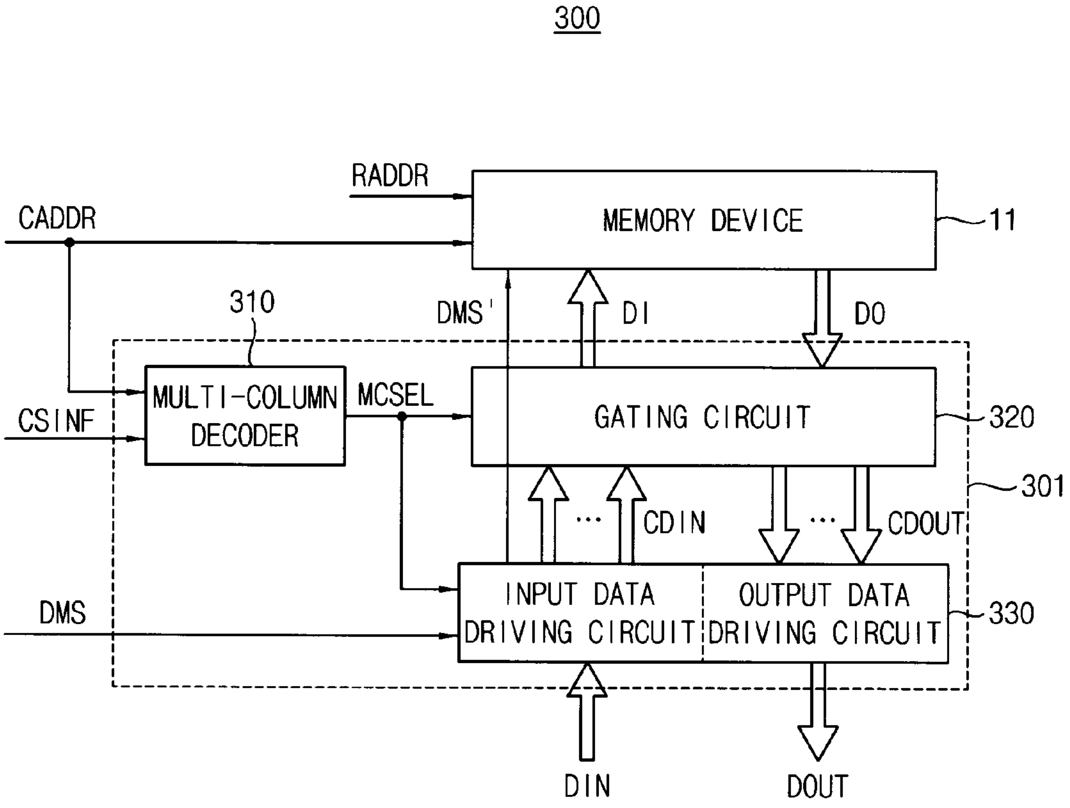

FIGS. 2A, 2B, and 2C are block diagrams illustrating a memory device accessing inconsecutive memory cells at a time according to example embodiments.

Referring to FIG. 2A, a memory device 100 includes a memory cell array 110, a row decoder 120, a multi-column decoder 130, a gating circuit 140, and an input/output data driving circuit 150.

The memory cell array 110 includes a plurality of memory cells arranged to form a plurality of rows and a plurality of columns. One row (e.g., TR) of the memory cell array 110 constitutes one page.

The row decoder 120 generates a row selection signal RSEL based on a row address RADDR to select a target row TR including a target memory cell among the plurality of rows.

The multi-column decoder 130 generates a multi-column selection signal MCSEL based on a column address CADDR and column selection information CSINF to select a plurality of target columns TC (hatched portion) including the target memory cell among columns included in the target row TR at a time. At this time, the column selection information CSINF has no restriction to indicate consecutive addresses of the target columns TC. In other words, the plurality of target columns TC (i.e., the addresses of the target columns TC) may not be consecutive.

In an example embodiment, the column selection information CSINF may be set based on a predefined column selection table. In another example embodiment, the column selection information CSINF may be set based on a column selection parameter. In still another example embodiment, the column selection information CSINF may be set based on a column selection list or a column selection information list. Specific implementation examples of the column selection information CSINF will be described below with reference to FIG. 6 and the like.

The gating circuit 140 is connected to the target row TR based on the row selection signal RSEL. In addition, the gating circuit 140 selects the plurality of target columns TC included in the target row TR based on the multi-column selection signal MCSEL, and connects the selected target columns TC to the input/output data driving circuit 150 at a time. For example, the gating circuit 140 may include a sense amplifier to sense the memory cells and stably process signals.

The input/output data driving circuit 150 writes input data DIN in the plurality of target columns TC at a time, or outputs data stored in the plurality of target columns TC at a time as output data DOUT based on the multi-column selection signal MCSEL and a data mask signal DMS. For example, the input/output data driving circuit 150 may include an input data driving circuit and an output data driving circuit.

In a data write operation, the plurality of target columns TC may be connected to the input data driving circuit through the gating circuit 140 based on the multi-column selection signal MCSEL. The input data DIN received by the input data driving circuit may be provided to the gating circuit 140 in units of column data CDIN, and stored in the plurality of target columns TC. At this time, undesired data can be prevented from being stored in the memory cell array 110 based on the data mask signal DMS.

In a data read operation, the plurality of target columns TC may be connected to the output data driving circuit through the gating circuit 140 based on the multi-column selection signal MCSEL. Page data (or row data) RD stored in the target row TR may be provided to the gating circuit 140, and the data of the plurality of target columns TC included in the target row TR may be provided to the output data drive circuit in units of column data CDOUT and may be output as output data DOUT.

When the column addresses corresponding to the plurality of target columns TC are not consecutive, an order of the target columns on the input data DIN or the output data DOUT may be changed according to the multi-column selection signal MCSEL, and the gating circuit 140 or the input/output data driving circuit 150 may include a circuit to align the target columns according to the order on the input/output data.

In an example embodiment, a size of the input/output data DIN or DOUT may be smaller than or equal to a size of the page data RD. For example, the size of the page data RD may be P (P is a natural number of two or more) bits, and the size of the input/output data DIN or DOUT may be K (K is a natural number of P or less) bits.

In an example embodiment, a size of the column data CDIN or CDOUT may be smaller than the size of the input/output data DIN or DOUT. For example, the size of the column data CDIN or CDOUT may be C bits (C is a natural number less than K). In this case, a plurality of columns (e.g., K/C columns) may be selected to store one input data DIN or to provide one output data DOUT. Accordingly, the input/output data DIN or DOUT is shown with one arrow, and the column data CDIN or CDOUT is shown with a plurality of arrows.

In an example embodiment, a size of one column that is set in the memory device 100 according to the present inventive concept (e.g., one rectangle included in the target row TR shown in FIG. 2A) may be smaller than a size of one column that is set in the conventional memory device 10 (e.g., one rectangle included in the row R0 shown in FIG. 1), and the inefficiency of accessing unnecessary cells can be reduced as the size of one column set in the memory device 100 is reduced.

Although not shown, the row address RADDR, the column address CADDR, the column selection information CSINF, and the data mask signal DMS may be provided from an external memory controller. The memory device 100 and the memory controller may constitute a memory system.

In the memory device 100 according to example embodiments, the multi-column decoder 130 may generate the multi-column selection signal MCSEL based on the column address CADDR and the column selection information CSINF, and the gating circuit 140 may select a plurality of inconsecutive target columns TC at a time based on the multi-column selection signal MCSEL. In other words, when compared with the conventional memory device 10, structure and operation of the multi-column decoder 130 and the gating circuit 140 may be changed. As a result, inconsecutive memory cells can be accessed at a time, thereby improving the performance and efficiency of the memory device 100.

Referring to FIG. 2B, a memory device 200 includes a memory cell array 210, a row decoder 220, a line decoder 230, a multi-column decoder 240, a first gating circuit 250, a second gating circuit 260, and an input/output data driving circuit 270.

Except that the gating circuit is formed in two stages and the line decoder 230 is thus further included in the memory device 200, the memory device 200 of FIG. 2B may have a structure similar to that of the memory device 100 of FIG. 2A. In the case where a physical restriction such as wiring channel space and high-speed signal transmission occurs in a gating circuit for multi-column selection because a size of one page (e.g., P bits) is relatively large, the gating circuit can be configured in two stages as shown in FIG. 2B. The columns selected by the first gating circuit 250 are defined as one line.

The memory cell array 210 includes a plurality of memory cells arranged to form a plurality of rows and a plurality of columns.

The row decoder 220 generates a row selection signal RSEL based on a row address RADDR to select a target row TR including a target memory cell among the plurality of rows.

The line decoder 230 generates a line selection signal LSEL based on the column address CADDR to select one target line TL including the target memory cell among a plurality of lines included in the target row TR. Each of the plurality of lines may be defined to be included in one row and to include at least two columns. For example, one page of P bits may be divided equally by L bits (L is a natural number less than or equal to P), and each of the divided units may be defined as one line. In this case, there are P/L lines in one page, and the line decoder 230 can generate the line selection signal LSEL based on a upper bit of the column address CADDR.

The multi-column decoder 240 generates the multi-column selection signal MCSEL based on the column address CADDR and the column selection information CSINF to select the inconsecutive target columns TC (hatched portion) including the target memory cell among the columns included in the target row TR and one target line TL at a time.

The first gating circuit 250 is connected to the target row TR based on the row selection signal RSEL, and selects one target line TL based on the line selection signal LSEL. The second gating circuit 260 selects the plurality of target columns TC included in one target line TL based on the multi-column selection signal MCSEL. For example, the first gating circuit 250 may include a sense amplifier to sense the memory cells and stably process a signals.

The input/output data driving circuit 270 writes the input data DIN in the plurality of target columns TC at a time or outputs data stored in the plurality of target columns TC as the output data DOUT at a time based on the multi-column selection signal MCSEL and the data mask signal DMS. For example, the input/output data driving circuit 270 may include an input data driving circuit and an output data driving circuit. In the data write operation, the plurality of target columns TC may be connected to the input data drive circuit through the gating circuits 250 and 260 based on the line selection signal LSEL and the multi-column selection signal MCSEL. In the data read operation, the plurality of target columns TC may be connected to the output data driving circuit through the gating circuits 250 and 260 based on the line selection signal LSEL and the multi-column selection signal MCSEL.

As described above, one page may include one or a plurality of lines. In an example embodiment, in the case where one page is composed of one line, the first gating circuit 250 may operate as a bypass circuit. In this case, the memory device 200 of FIG. 2B may operate substantially the same as the memory device 100 of FIG. 2A. In another example embodiment, in the case of always selecting all the columns in the line, the second gating circuit 260 may operate as a bypass circuit. In this case, the line decoder 230 may operate substantially the same as the column decoder 40 included in the existing memory device 10.

In the memory device 200 according to example embodiments, the line decoder 230 may generate the line selection signal LSEL based on the column address CADDR, the first gating circuit 250 may select one target line TL based on the line selection signal LSEL, and the multi-column decoder 240 and the second gating circuit 260 may be substantially the same as the multi-column decoder 130 and the gating circuit 140 shown in FIG. 2A, respectively. In other words, when compared with the conventional memory device 10, the present inventive concept may be implemented by further including the multi-column decoder 240 and the second gating circuit 260. Therefore, the inconsecutive memory cells can be accessed at a time, thereby improving the performance and efficiency of the memory device 200.

In the example embodiment of FIG. 2B, when a size of one line increases, column selection can be implemented with an increased degree of freedom, so that a failure of accessing cells at a time can be reduced when accessing the cells having inconsecutive memory addresses in one page.

Referring to FIG. 2C, a memory device 300 includes a first memory device 11 and an additional circuit 301. The additional circuit 301 includes a multi-column decoder 310, a gating circuit 320, and an input/output data driving circuit 330.

The first memory device 11 includes a plurality of memory cells arranged to form a plurality of rows and a plurality of columns, selects a target row including a target memory cell among the plurality of rows based on a row address RADDR, and selects a target line including the target memory cell among a plurality of lines included in the target row based on a column address CADDR.

The first memory device 11 may be substantially the same as the conventional memory device 10 of FIG. 1. For example, the first memory device 11 may include a memory cell array, a row decoder, a line decoder, a gating circuit, and an input/output data driving circuit. If one column in the conventional memory device 10 (e.g., C0 shown in FIG. 1) is considered as one line in the memory device according to example embodiments (e.g., TL shown in FIG. 2B), the column decoder of the conventional memory device 10 may serve as the line decoder of the first memory device 11.

In addition, it may be considered that the first memory device 11 includes the line decoder 230 and the first gating circuit 250 shown in FIG. 2B. Accordingly, if the multi-column decoder 310, the gating circuit 320, and the input/output data driving circuit 330 are added to the first memory device 11, the memory device 300 of FIG. 2C may operate substantially the same as the memory device 200 of FIG. 2B.

The multi-column decoder 310 generates the multi-column selection signal MCSEL based on the column address CADDR and the column selection information CSINF to select the inconsecutive target columns including the target memory cell among the columns included in the target line at a time.

The gating circuit 320 selects the target columns in the target line based on the multi-column selection signal MCSEL. Unlike the gating circuits 140 and 250 of FIGS. 2A and 2B, the gating circuit 320 may not include a sense amplifier.

The input/output data driving circuit 330 writes the input data DIN in the target columns TC at a time or outputs data stored in the target columns TC at a time as the output data DOUT based on the multi-column selection signal MCSEL and the data mask signal DMS. The input/output data driving circuit 330 may include an input data driving circuit and an output data driving circuit.

In the data write operation, the target columns included in the target line may be connected to the input data driving circuit through the gating circuit 320 based on the multi-column selection signal MCSEL. The input data DIN received in the input data driving circuit may be provided to the gating circuit 320 in units of the column data CDIN, and data DI provided from the gating circuit 320 may be stored in the target columns included in the target line in the first memory device 11. At this time, the input data driving circuit may generate an enhanced data mask signal DMS' based on the data mask signal DMS and the multi-column selection signal MCSEL, and the first memory device 11 may prevent data from being stored in an unselected column except from the target columns in the target line based on the enhanced data mask signal DMS'.

In the data read operation, the first memory device 11 may provide data DO corresponding to the target line, and the target columns included in the target line may be connected to the output data driving circuit through the gating circuit 320 based on the multi-column selection signal MCSEL. The data of the target columns among the data DO may be provided to the output data driving circuit in units of column data CDOUT, and outputted as the output data DOUT.

In the memory device 300 according to example embodiments, the multi-column decoder 310 and the gating circuit 320 may be substantially the same as the multi-column decoder 130 and the gating circuit 140 shown in FIG. 2A, and the multi-column decoder 240 and the second gating circuit 260 shown in FIG. 2B, respectively. In other words, when compared with the conventional memory device 10, the present inventive concept may be implemented by further including the multi-column decoder 310 and the gating circuit 320. Therefore, the inconsecutive memory cells can be accessed at a time, thereby improving the performance and efficiency of the memory device 300.

FIGS. 3A, 3B, 3C, 3D, 4A, 4B, 5A, 5B, 5C, 5D, and 5E are diagrams to describe an operation of the memory device according to example embodiments.

First, FIGS. 3A, 3B, 3C, and 3D are diagrams illustrating various memory address mapping schemes of multimedia data. In FIGS. 3A, 3B, 3C and 3D, one pixel is shown as one smallest square, and a screen of one frame is shown as a rectangle with a thick solid line including 18×6 pixels. Assuming that a pixel data size is a 32-bit word, a memory address corresponding to each pixel position is increased in word units, and the memory address is expressed in hexadecimal numbers after an alphabet "w". A diagonally hatched rectangle represents a virtual pixel that does not exist while occupying a memory address space.

Figure 3A:
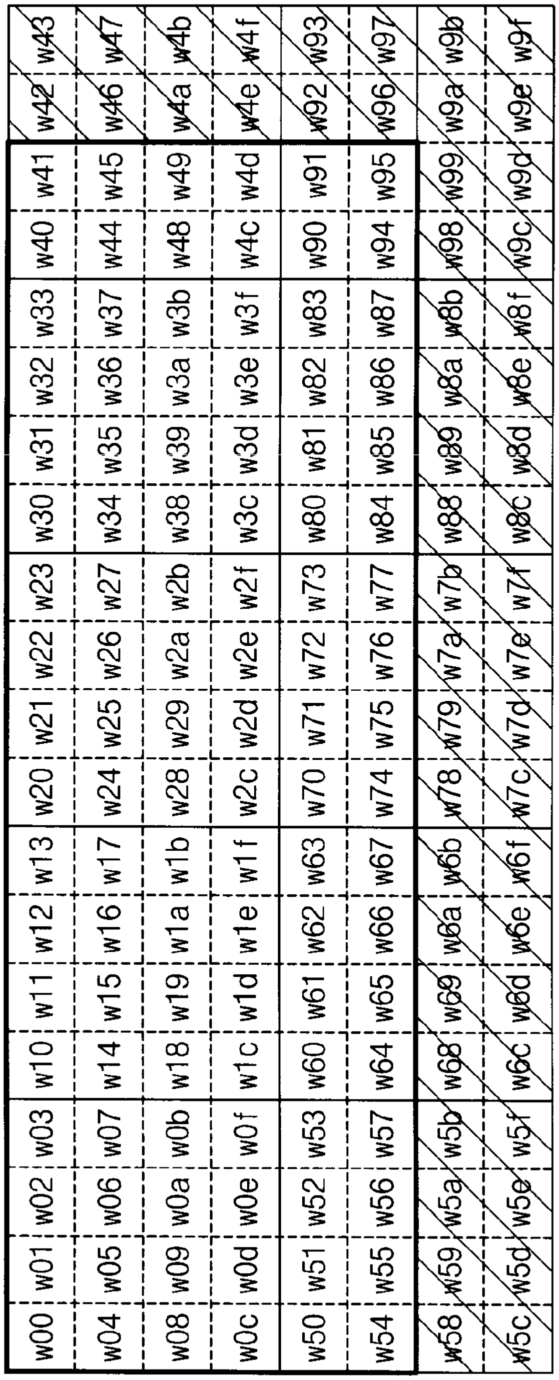

Referring to FIG. 3A, a memory address mapping using a tile scheme is performed on a screen of one frame. In FIG. 3A, one tile is shown as a square with a thin solid line including 4×4 pixels. Since the pixels in one tile are mapped adjacent to each other in the memory address space, a memory can be efficiently accessed when data is processed in consideration of the locality of the pixel data. However, since there is directionality in the memory address mapping even in the tile, the memory access efficiency can be relatively decreased when the adjacent pixels are processed in a specific direction. Although there is a waste in memory use due to the virtual pixel, the memory address of each pixel may be easily calculated. In the example of FIG. 3A, the least significant two bits of the memory address represent a horizontal position of each pixel in the tile, next two bits represent a vertical position, and next upper bits represent a position of the tile.

Referring to FIG. 3B, a memory address mapping using a raster scheme is performed on a screen of one frame. Since the memory address is sequentially increased and mapped to each pixel in the direction of a horizontal scanning line, the memory access efficiency is improved when the pixel data is sequentially generated and consumed in the direction of the horizontal scanning line. Since there is no virtual pixel, there is no waste in memory use, whereas calculation can be complicated when the memory address is obtained to read the pixel data at a specific position.

Referring to FIG. 3C, a memory address mapping using a raster scheme is performed on a screen of one frame. Since the virtual pixel is used to easily calculate an address of a horizontal leading pixel, there is a waste in memory use. Accordingly, the degree of the waste in memory use can be reduced compared to the tile scheme.

Figure 3D:
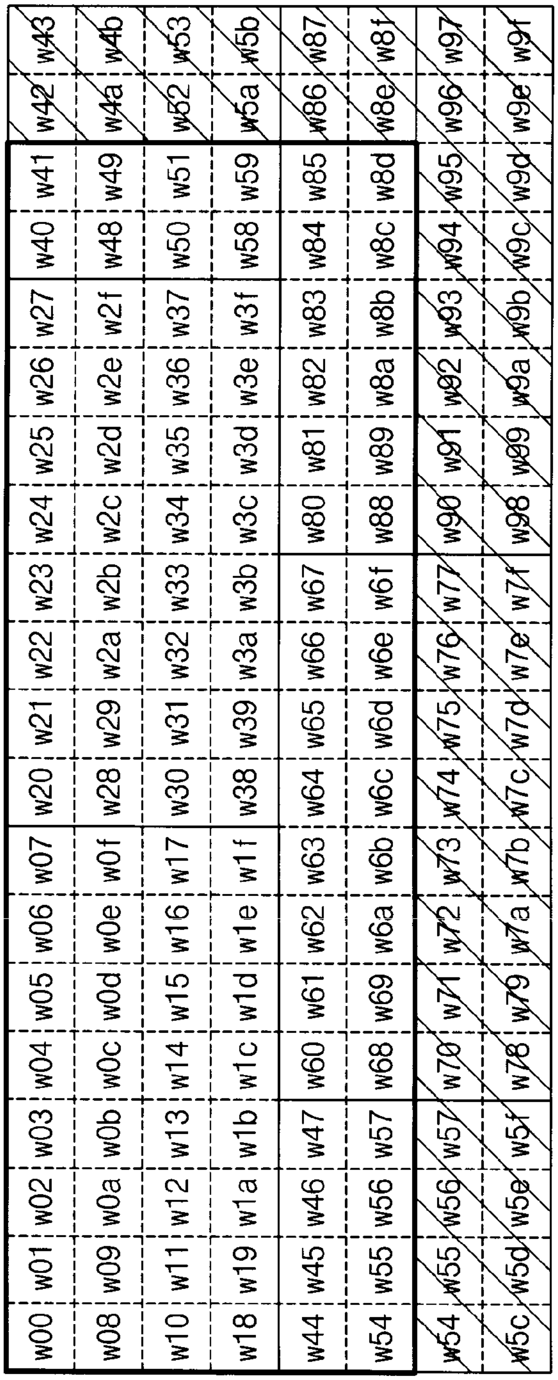

Referring to FIG. 3D, a memory address mapping using a super-tile scheme is performed on a screen of one frame. A super tile may be defined as $2^n$ tiles (n is a positive integer) serially connected in the horizontal direction. In FIG. 3D, one tile is defined as including 4×4 pixels, and the super tile in which two tiles are connected to each other in the horizontal direction is shown as a rectangle with a thin solid line. The super tile is ene a tile in itself. In addition, the super tile and corresponding tiles may be referred to as a tile and sub-tiles, respectively.

When pixel data is sequentially generated and consumed in the direction of the horizontal scanning line as the number of pixels in the horizontal direction increases in the super tile, the memory access efficiency can be improved as compared with the tile scheme. However, the super tile scheme may become somewhat disadvantageous compared to the tile scheme when accessing the memory to process data with the strong locality. Meanwhile, there is a waste in memory use similar to the tile scheme, and the memory address of each pixel may be easily calculated similar to the tile scheme. In the example of FIG. 3D, the least significant three bits of the memory address represent a horizontal position of each pixel in the super tile, next two bits represent a vertical position, and next upper bits represent a position of the super tile. Particularly, if a third lower bit of the memory address is moved to a fifth lower bit, a tile-type memory address is obtained. Therefore, the memory address translation between the tile scheme and the super tile scheme can be facilitated.

The memory address mapping using the super tile scheme may be applied to multi-dimensional data with a third dimension or higher. For example, in FIG. 3D, the fifth lower bit of the memory address may be an index representing the third dimension. The third dimension may be a height or a time.

FIGS. 4A and 4B are views illustrating a method of expressing pixel data of multimedia data, and represent the pixel data of the screen of one frame.

Referring to FIG. 4A, the numbering of pixel data is performed based on the memory address mapping using the tile scheme. For example, FIG. 4A is obtained by numbering the pixel data by replacing the alphabet "w" of the memory address mapped to each pixel position shown in FIG. 3A with an alphabet "p" representing a pixel, and expressing the pixel data at each pixel position. For the following examples, the pixel data corresponding to a first horizontal scanning line is emphasized in boldface. Such numbering of the pixel data may be similarly applied to FIGS. 3B, 3C, and 3D.

Referring to FIG. 4B, FIG. 4B is obtained by rotating the screen of FIG. 4A in a clockwise direction by 90 degrees. In the following examples, the expression of the original pixel data is maintained because a case of using original data for the image processing of the rotated screen will be dealt with. In addition, the pixel data corresponding to first two horizontal scanning lines are emphasized in boldface.

Figure 5A:
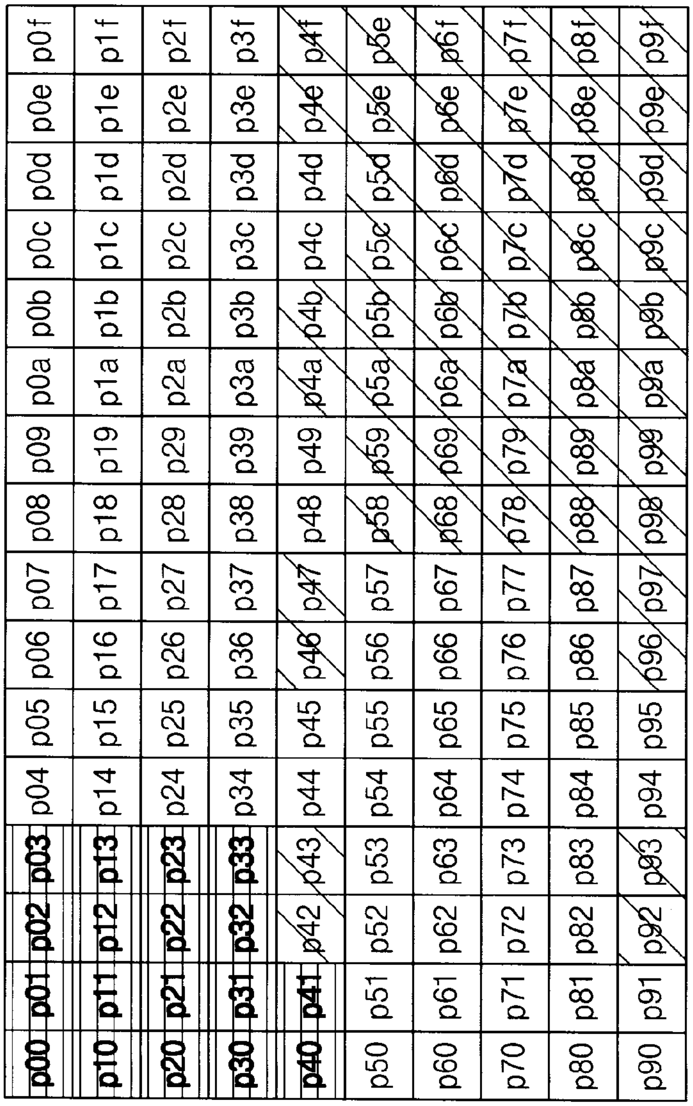

FIGS. 5A, 5B, 5C, and 5D are diagrams illustrating examples in which the pixel data of FIG. 4A is stored in a memory device, and FIG. 5E is a diagram illustrating an example in which the pixel data of FIG. 4B is stored in a memory device. In FIGS. 5A, 5B, 5C, 5D, and 5E, a size of one smallest square is set as one word, one pixel data is stored in one square, and the memory address is increased in word units from left to right. Pixels corresponding to the pixels emphasized in FIGS. 4A and 4B are emphasized in the same manner. Similar to FIGS. 3A, 3B, 3C, and 3D, a diagonally hatched rectangle represents virtual pixel data.

Referring to FIG. 5A, the pixel data is stored in the memory device based on the memory address mapping using the tile scheme. Since the addresses mapped to pixel data p00, p01, p02, p03, p10, p11, p12, p13, p20, p21, p22, p23, p30, p31, p32, p33, p40, and p41 corresponding to the first horizontal scanning line shown in FIG. 4A are not consecutive, the conventional memory device 10 has to access the pixel data by four pixels at a time, whereas the memory device according to example embodiments may increase the number of pixels to be accessed at a time by increasing a line size. In other words, if the line size is 32 words, eight pixels can be accessed at a time.

Referring to FIGS. 5B and 5C, the pixel data is stored in the memory device based on the memory address mapping using the raster scheme. Since the raster scheme is suitable for processing the pixel data in the direction of the horizontal scanning line, there is no performance improvement in the memory device according to example embodiments compared to the existing memory device 10.

Figure 5D:
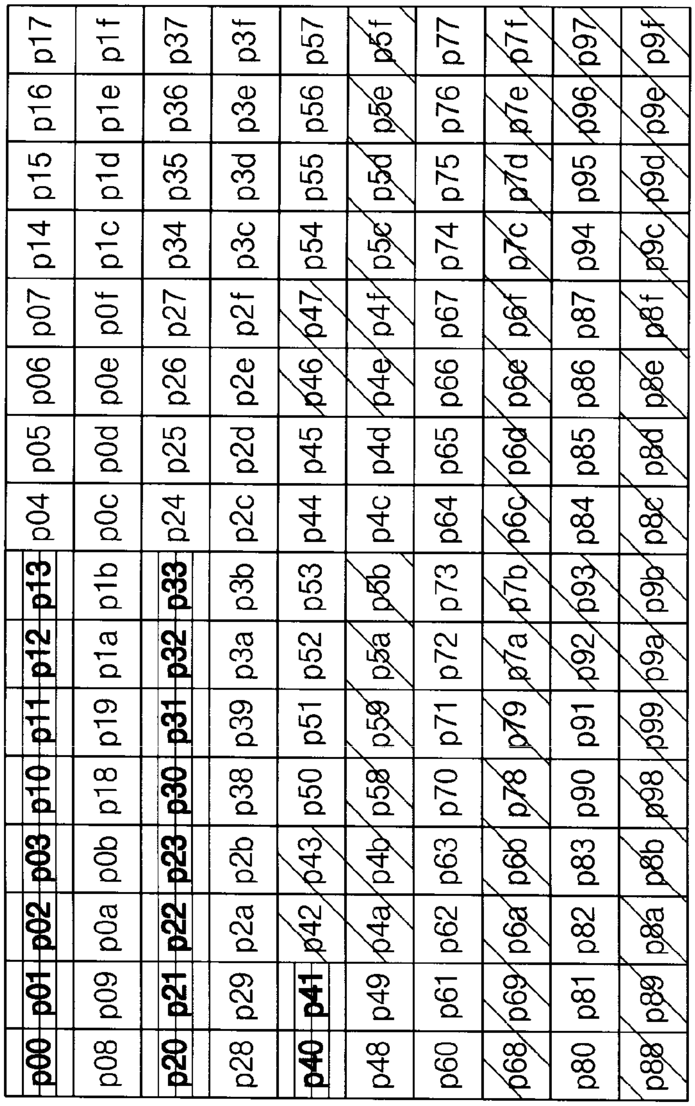

Referring to FIG. 5D, the pixel data is stored in the memory device based on the memory address mapping using the super tile scheme. Since the super tile is obtained by attaching two tiles to each other, eight pixel data are mapped to consecutive memory addresses. In other words, even if the line size is not increased, a horizontal size of the super tile may be increased to increase the number of pixels to be accessed at a time.

Referring to FIG. 5E, similar to FIG. 5A, the pixel data is stored in the memory device based on the memory address mapping using the tile scheme. In particular, it shows the case of accessing the pixel data based on the screen rotated in the clockwise direction as shown in FIG. 4B. When accessing the pixel data p00, p01, p04, p05, p08, p09, p0*c*, p0*d*, p50, p51, p54, and p55 corresponding to the first two horizontal scanning lines shown in FIG. 4B, the existing memory device 10 has to access two pixel data at a time through six times, whereas the memory device according to the example embodiments may access the pixel data two times when the line size is 16 words. When the conventional memory device 10 is used, the number of accesses may be reduced if the pixel data corresponding to the four horizontal scanning lines are read and stored in an internal buffer memory for use. However, as the screen size is gradually getting larger, more internal buffer memory capacity is required, which leads to an increase in costs.

FIGS. 6, 7A, 7B, 7C, 8A, and 8B are diagrams to describe a configuration of column selection information used in the memory device according to example embodiments.

Referring to FIG. 6, a column selection table including a column selection mode to select column selection information CSINF is shown. The column selection table may be predefined and stored in the multi-column decoder. In the example of FIG. 6, one line is shown to include eight columns.

A first mode (mode 00) is a default mode, and may have substantially the same access pattern as the existing memory device 10 because the consecutive columns are accessed. A second mode (mode 10) and a third mode (mode 11) may be modes to access the inconsecutive memory cells at a time according to example embodiments. In the second mode (mode 10) and the third mode (mode 11), odd-numbered column groups or even-numbered column groups among a plurality of column groups in which the columns included in the target row are grouped by units of X (X is a natural number of 2 or more) may correspond to the target columns. For example, in the second mode (mode 10), four columns may be grouped into one column group to set a plurality of column groups, and the odd column group or the even column group may be accessed. In the third mode (mode 11), two columns may be grouped into one column group to set a plurality of column groups, and the odd column groups or the even column groups may be accessed. For example, the third mode (mode 11) may be a mode to access the target columns TC shown in FIGS. 2A and 2B at a time.

Two columns are defined to be selected for each mode. The choice can be made between two columns by the memory address transmitted to the memory device, so it is unnecessary to divide the modes.

In the example of FIG. 6, the column selection information CSINF may be provided in the form of a mode selection signal having a relatively small number of bits. For example, the column selection information CSINF may be provided in the form of "00", "10", and "11" in the first mode (mode 00), the second mode (mode 10), and the third mode (mode 11), respectively.

The method based on the column selection table shown in FIG. 6 may be useful when a desired column selection mode is standardized in several types. For example, accessing the pixel data based on the rotated screen when a memory address is mapped in a tiled scheme as shown in FIG. 5E may correspond to the above case. For example, the original screen may be accessed in the first mode (mode 00), and the rotated screen may be accessed in the third mode (mode 11).

Figure 7A:
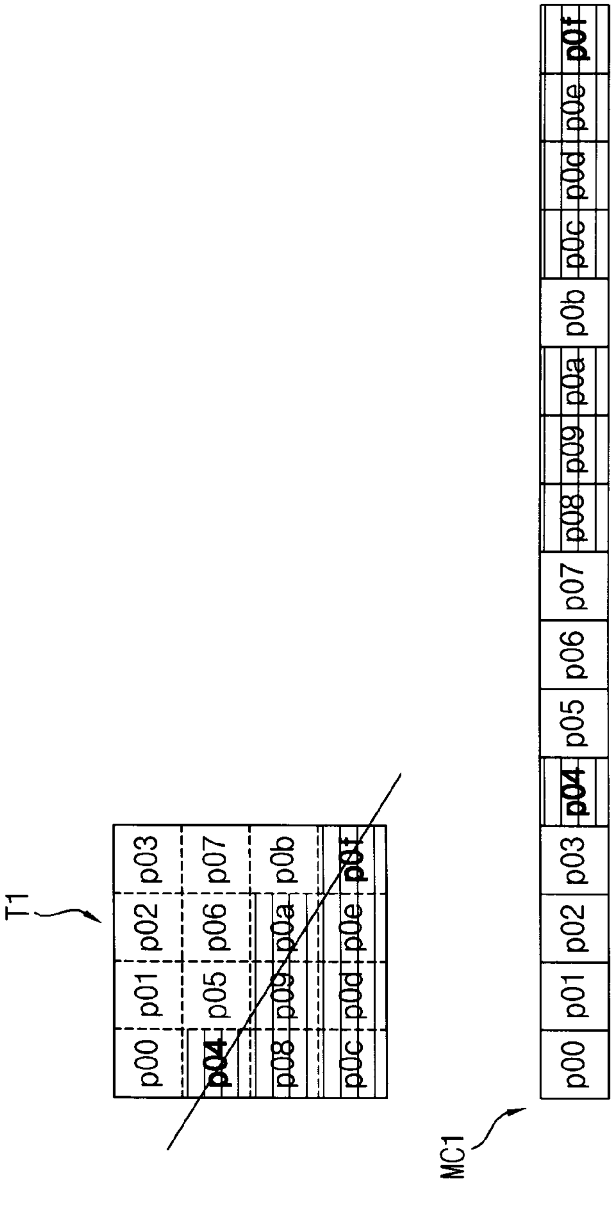
Figure 7B:
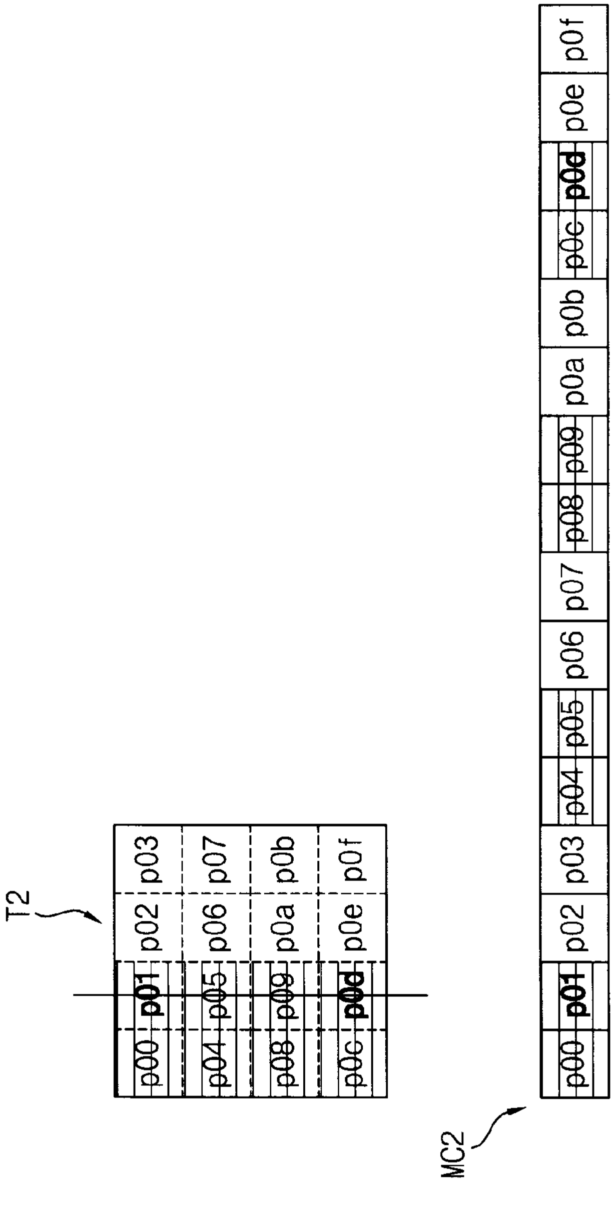
Figure 7C:
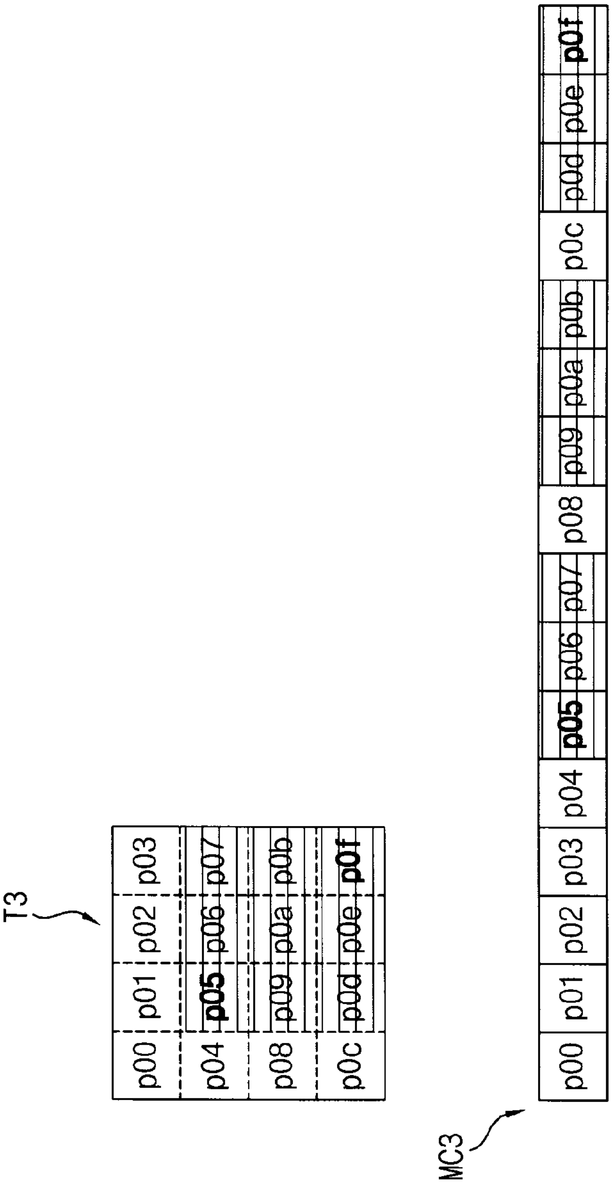

FIGS. 7A, 7B, and 7C show examples of setting the column selection information CSINF based on the column selection parameter.

Referring to FIGS. 7A, 7B, and 7C, the data stored in the target row may be multimedia data mapped in a tile scheme. For example, data stored in the memory cells MC1 may be the pixel data of a tile T1, data stored in the memory cells MC2 may be the pixel data of a tile T2, and data stored in the memory cells MC3 may be the pixel data of a tile T3.

In the examples of FIGS. 7A, 7B, and 7C, the column selection information CSINF may be set based on the column selection parameter. The column selection parameter may include information on two pixels corresponding to the target columns included in the target row among a plurality of pixels included in one tile, and side information indicating positions of pixels corresponding to the target columns with respect to a virtual line that connects the two pixels.

In other words, the virtual line is drawn to include all of the pixel data to be selected in one tile, and only the pixel data at one side may be accessed based on the virtual line. At this time, since the virtual line may be defined by two pixels in a tile, information on the two pixels in the tile and the side information can be transmitted as parameters. If the virtual line is defined only by edge pixels of the tile, an amount of information to be transmitted as the parameter can be reduced. The side information may be represented by a flag of one bit. For example, it can be defined as upward when the flag is "1", and defined as downward when the flag is "0". If the virtual line is a vertical line, it can be defined as left when the flag is "1", and defined as right when the flag is "0".

FIG. 7A shows a case in which pixel data on a lower side of the virtual line is accessed when the virtual line passes through pixels corresponding to p04 and p0*f*. At this time, when the column selection parameter of (04, 0f, 0) is transmitted as the column selection information CSINF, the column selection parameter of (04, 0f, 0) may be configured as the column selection list of (04, 08, 09, 0a, 0c, 0d, 0e, 0f) in the memory device according to example embodiments to access desired pixel data.

FIG. 7B shows a case in which pixel data on a left side of the virtual line is accessed when the virtual line passes through pixels corresponding to p01 and p0*d*. At this time, when the column selection parameter of (01, 0d, 1) is transmitted as the column selection information CSINF, the column selection parameter of (01, 0d, 1) may be configured as the column selection list of (00, 01, 04, 05, 08, 09, 0c, 0d) in the memory device according to example embodiments to access desired pixel data. The example of FIG. 7B and the third mode (mode 11) of FIG. 6 may provide substantially the same column selection information.

In the example of FIG. 7C, the column selection information CSINF may be set based on the column selection parameter. The column selection parameter may include position information of two pixels in one tile, and the target columns may correspond to pixels within a virtual rectangle that has diagonal vertices at the two pixels.

FIG. 7C shows a case in which pixel data within the virtual rectangle having p05 and p0*f* as vertices are accessed. At this time, when the column selection parameter of (05, 0f) is transmitted as the column selection information CSINF, the column selection parameter of (05, 0f) may be configured as the column selection list of (05, 06, 07, 09, 0a, 0b, 0d, 0e, 0f) in the memory device according to example embodiments to access desired pixel data.

Figure 8A:
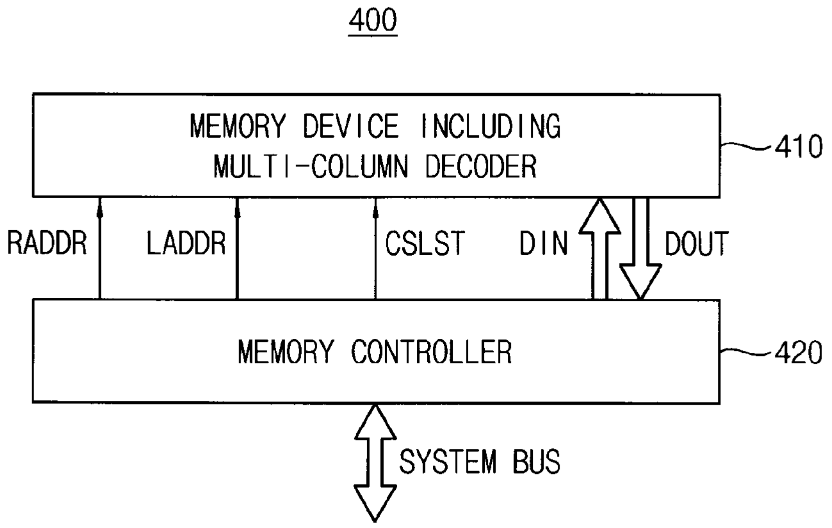

Referring to FIG. 8A, a memory device 410 according to example embodiments and a memory controller 420 may constitute a memory system 400. In the example of FIG. 8A, the column selection information CSINF may be provided in the form of a column selection list CSLST. The column selection list CSLST may directly include information on the target columns to be selected. For example, when there is no severe restriction for a pin count of an interface as in the case where the memory device 410 is embedded, the columns to be selected can be directly transmitted as a list.

In an example embodiment, a pin may be assigned as many as the number of selectable columns to allow each row to correspond to the pin, and only pins corresponding to the columns to be selected may be set to a value of "1". In other words, the column selection list CSLST may include a plurality of bits corresponding to a plurality of columns, and it can be defined as being selected when each bit is "1", and defined as being unselected when each bit is "0". In this case, the column selection list CSLST of "11111111" may be provided for the first mode (mode 00) of FIG. 6, the column selection list CSLST of "11110000" may be provided in the second mode (mode 10), and the column selection list CSLST of "11001100" may be provided in the third mode (mode 11).

In the example of FIG. 8A, since the information of the entire column to be selected is transmitted through the column selection list CSLST, a line address LADDR can be transmitted instead of the column address.

Figure 8B:
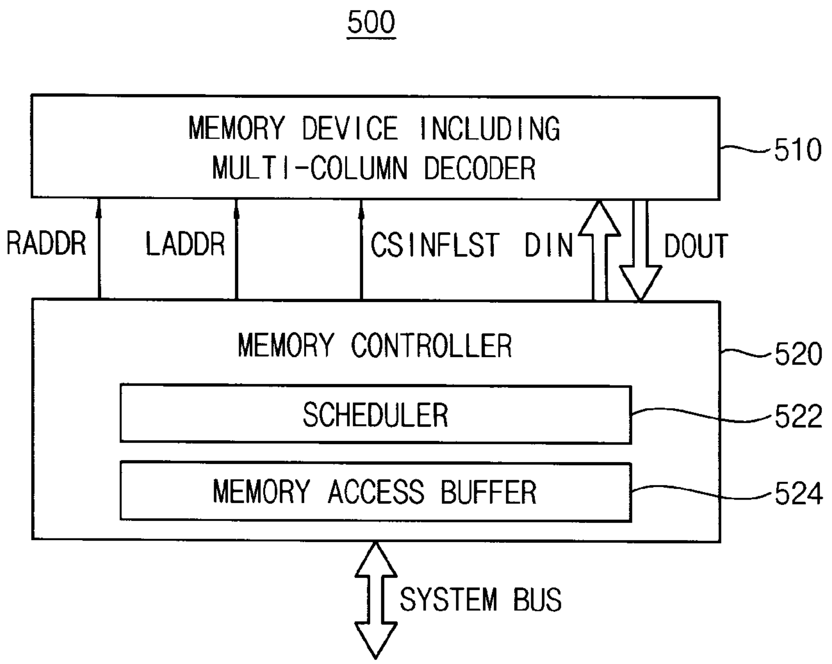

Referring to FIG. 8B, a memory device 510 according to example embodiments and a memory controller 520 may constitute a memory system 500. In the example of FIG. 8B, the column selection information CSINF may be provided in the form of a column selection information list CSINFLST. For example, if one line is divided into a plurality of sub-lines and the column selection information is set based on a predefined column selection table (e.g., the column selection table of FIG. 6) for each sub-line, the column selection information list CSINFLST may have a form where the column selection modes for sub-lines are combined.

The memory controller 520 may include a scheduler 522 and a memory access buffer 524. The scheduler 522 collects accesses having the same row address and regarding the sub-line of the memory device 510 as the line TL of FIG. 2B to access the memory device 510 at a time. For example, the column selection information list CSINFLST for each of the sub-lines may be transmitted to the memory device 510. For example, if first and second sub-lines among the sub-lines are accessed as in the second mode (mode 10), and third and fourth sub-lines are accessed as in the third mode (mode 11), the column selection information list CSINFLST of "10", "10", "11", and "11" can be transmitted to the memory device 510.

Figure 9:
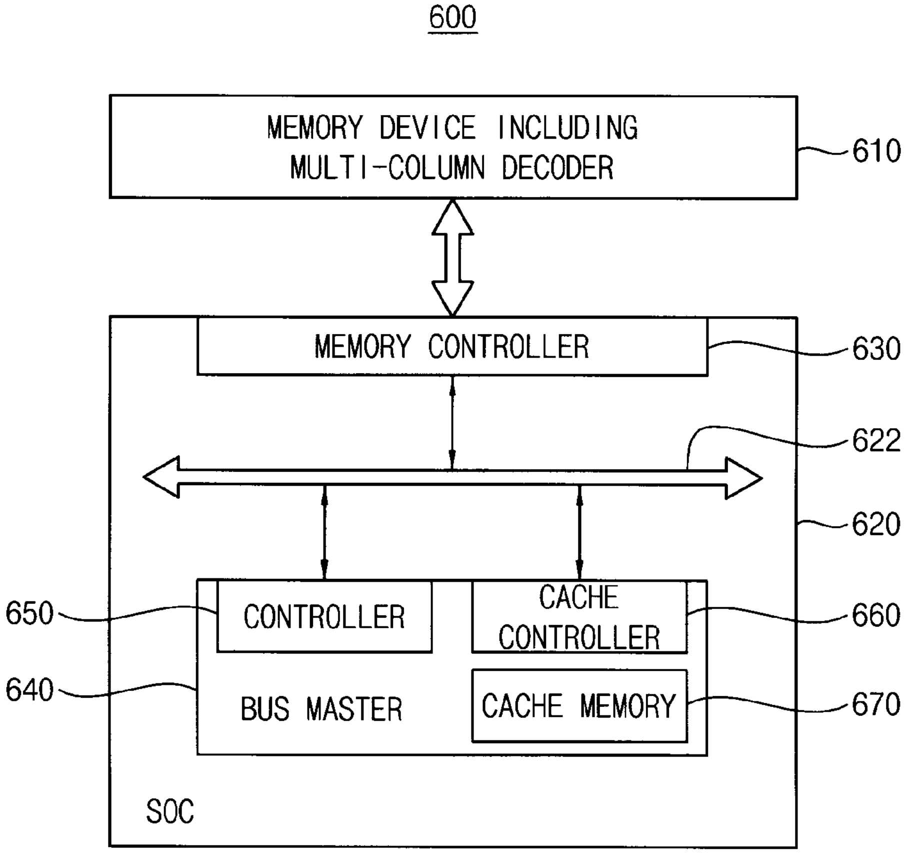
FIG. 9 is a block diagram illustrating an electronic system including the memory device according to example embodiments.

FIG. 9 is a block diagram illustrating an electronic system including the memory device according to example embodiments.

Referring to FIG. 9, an electronic system 600 includes a memory device 610 and a system-on-chip (SOC) 620.

The memory device 610 may be a memory device according to example embodiments. For example, the memory device 610 may be one of the memory devices 100, 200, and 300 shown in FIGS. 2A, 2B, and 2C, and may include a multi-column decoder. The memory device 610 includes a plurality of memory cells arranged to form a plurality of rows and a plurality of columns, generates a row selection signal based on a row address to select a target row from the rows, generates a multi-column selection signal based on a column address and column selection information to select a plurality of target columns from columns included in the target row at a time, selects the plurality of target columns at a time based on the multi-column selection signal, and writes input data to the plurality of target columns at a time or outputs data stored in the plurality of target columns at a time as output data based on the multi-column selection signal and a data mask signal.

The system-on-chip 620 includes a bus 622, a memory controller 630, and a bus master 640.

The memory controller 630 controls overall operation of the memory device 610. The bus master 640 is connected to the memory device 610 through the bus 622 and the memory controller 630, and controls an access to the memory device 610. The memory device 610 may be used as a main memory, and the bus master 640 generates the row address, the column address, and the column selection information provided to the memory device 610.

The bus master 640 may include a controller 650 and a cache controller 660, and may further include a cache memory 670. The controller 650 may control an overall access to the memory device 610. The cache controller 660 may control the overall access to the cache memory 670. The structure and operation of the controller 650 and the cache controller 660 will be described below with reference to FIG. 10A and the like.

In an example embodiment, the bus master 640 may be any of a functional unit or an intellectual property (IP) that is capable of accessing the memory device 610 and is included in the system-on-chip 620, such as a central processing unit (CPU), a graphic processing unit (GPU), or the like.

Figure 10A:
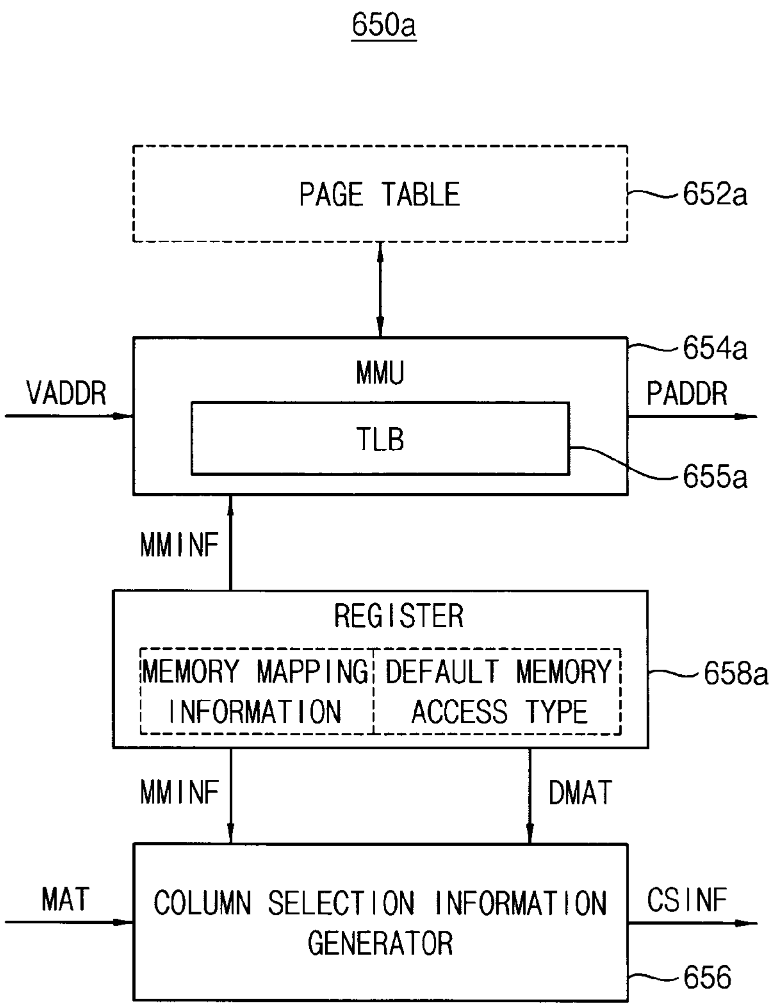
FIGS. 10A and 10B are block diagrams illustrating examples of a controller included in a bus master of the electronic system shown in FIG. 9.
Figure 10B:
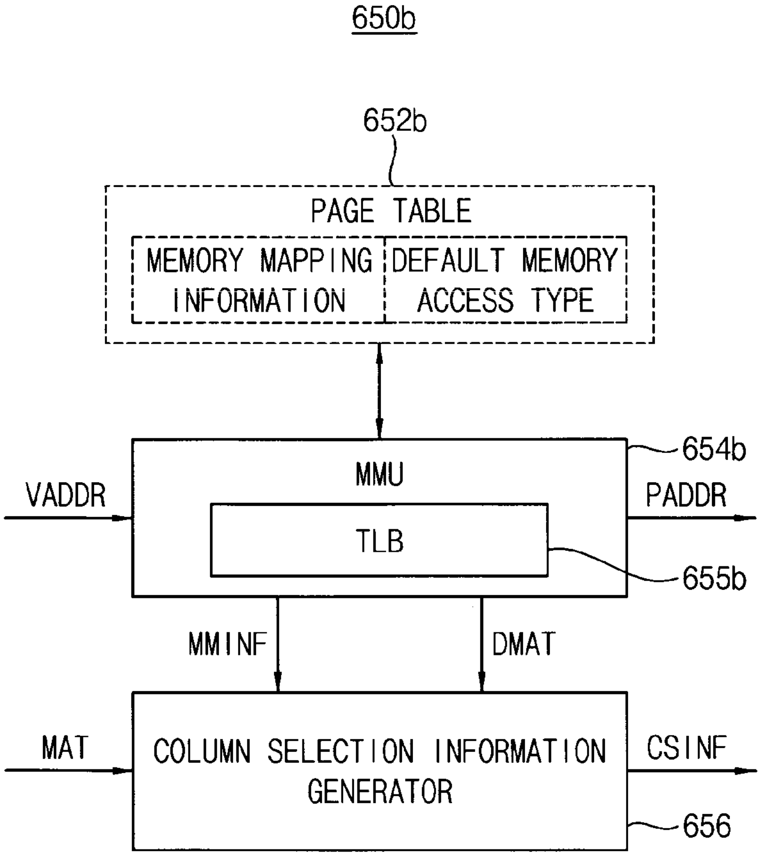

FIGS. 10A and 10B are block diagrams illustrating examples of a controller included in a bus master of the electronic system shown in FIG. 9.

Referring to FIG. 10A, a controller 650*a* includes a memory management unit (MMU) 654*a* and a column selection information generator 656. The controller 650*a* may further include a register 658*a*.

The memory management unit 654*a* generates a physical address PADDR based on a virtual address VADDR and memory mapping information MMINF. The physical address PADDR may include the row address and the column address provided to the memory device 610 of FIG. 9. The memory management unit 654*a* may include a translation lookaside buffer (TLB) 655*a*, and may improve an address translation speed by reading information of a page table 652*a*, storing the information in the translation lookaside buffer 655*a* for use. For example, the page table 652*a* may be stored in a separate storage space.

The bus master 640 may access the memory device 610 while assuming a virtual memory mapping scheme different from an actual memory mapping scheme. When using the virtual memory mapping, the memory access of the memory device 610 is implemented with a degree of freedom as if information recorded in the super tile scheme is read through the tile scheme, thereby increasing the efficiency. When the physical memory mapping scheme differs from the virtual memory mapping scheme, memory addresses are different from each other, so that appropriate address translation is required according to the mapping scheme, and information required at this time may be defined as the memory mapping information MMINF. For example, the memory mapping information may be determined in a memory allocation step.

When the virtual memory mapping scheme and memory access type information MAT where the raster scheme, the tile scheme, and a rotation state are combined are given, the column selection information generator 656 may generate the column selection information CSINF based on the physical memory mapping scheme of the memory mapping information MMINF. The column selection information generator 656 may generate the column selection information CSINF based on the memory mapping information MMINF and default memory access type information DMAT when the memory access type information MAT does not exist or is invalid.

The register 658*a* may store the memory mapping information MMINF and the default memory access type information DMAT. In other words, the controller 650*a* of FIG. 10A shows a case where the memory mapping information MMINF and the default memory access type information DMAT are stored and used in the register of the bus master.

Referring to FIG. 10B, the controller 650*b* includes a memory management unit 654*b* and a column selection information generator 656*b*.

Except that the memory mapping information MMINF and the default memory access type information DMAT are stored in the page table 652*b* instead of a separate register, the controller 650*b* of FIG. 10B may be substantially the same as the controller 650*a* of FIG. 10A. In other words, the controller 650*b* of FIG. 10B shows a case where the memory mapping information MMINF and the default memory access type information DMAT are stored and used in the page table, and the register 658*a* may be omitted in this case. The memory mapping information MMINF and the default memory access type information DMAT may be provided to the column selection information generator 656 through a translation lookaside buffer 655*b* of the memory management unit 654*b*.

Figure 11A:
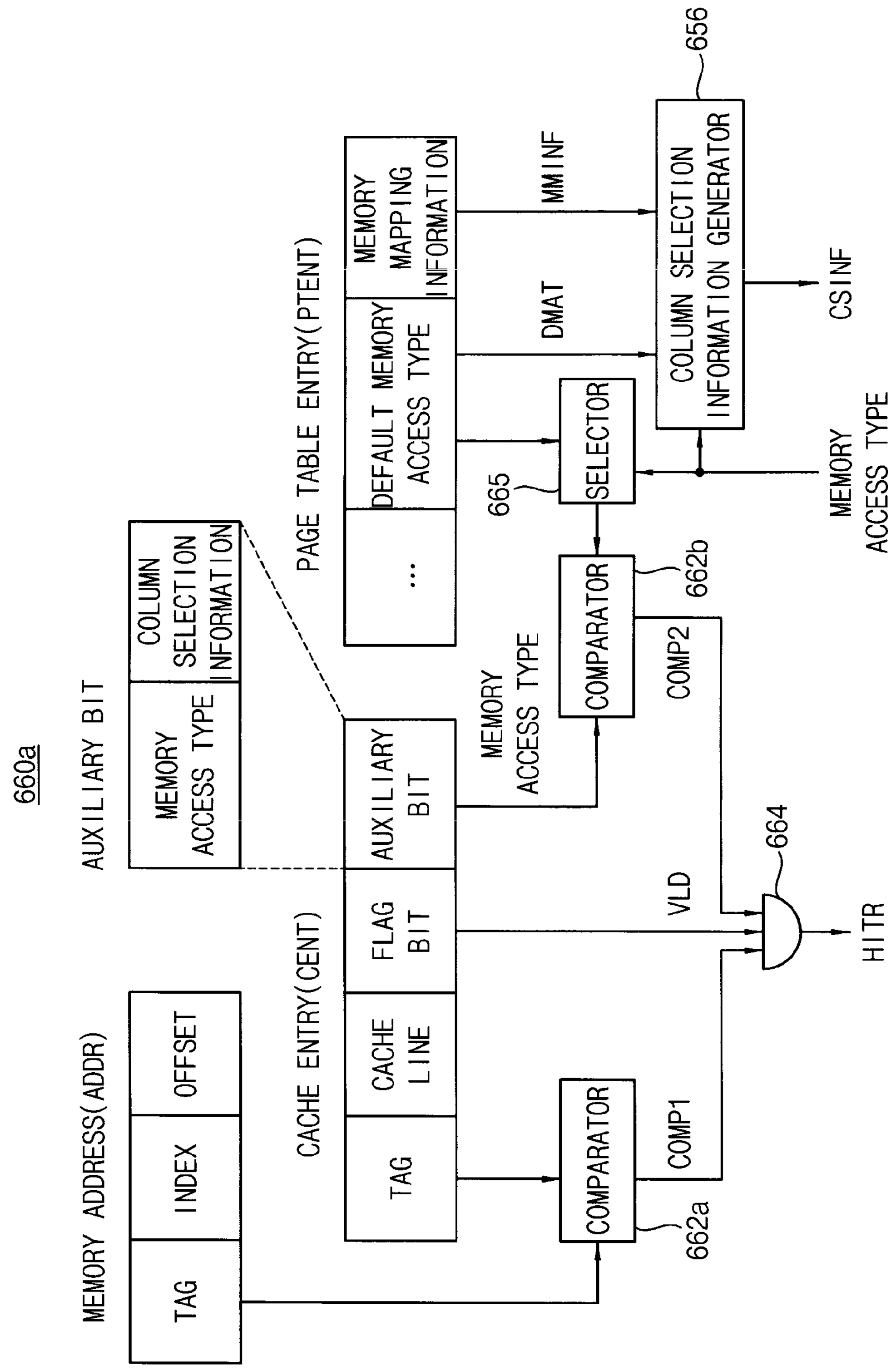
FIGS. 11A, 11B, and 11C are block diagrams illustrating examples of a cache controller included in the bus master of the electronic system shown in FIG. 9.
Figure 11B:
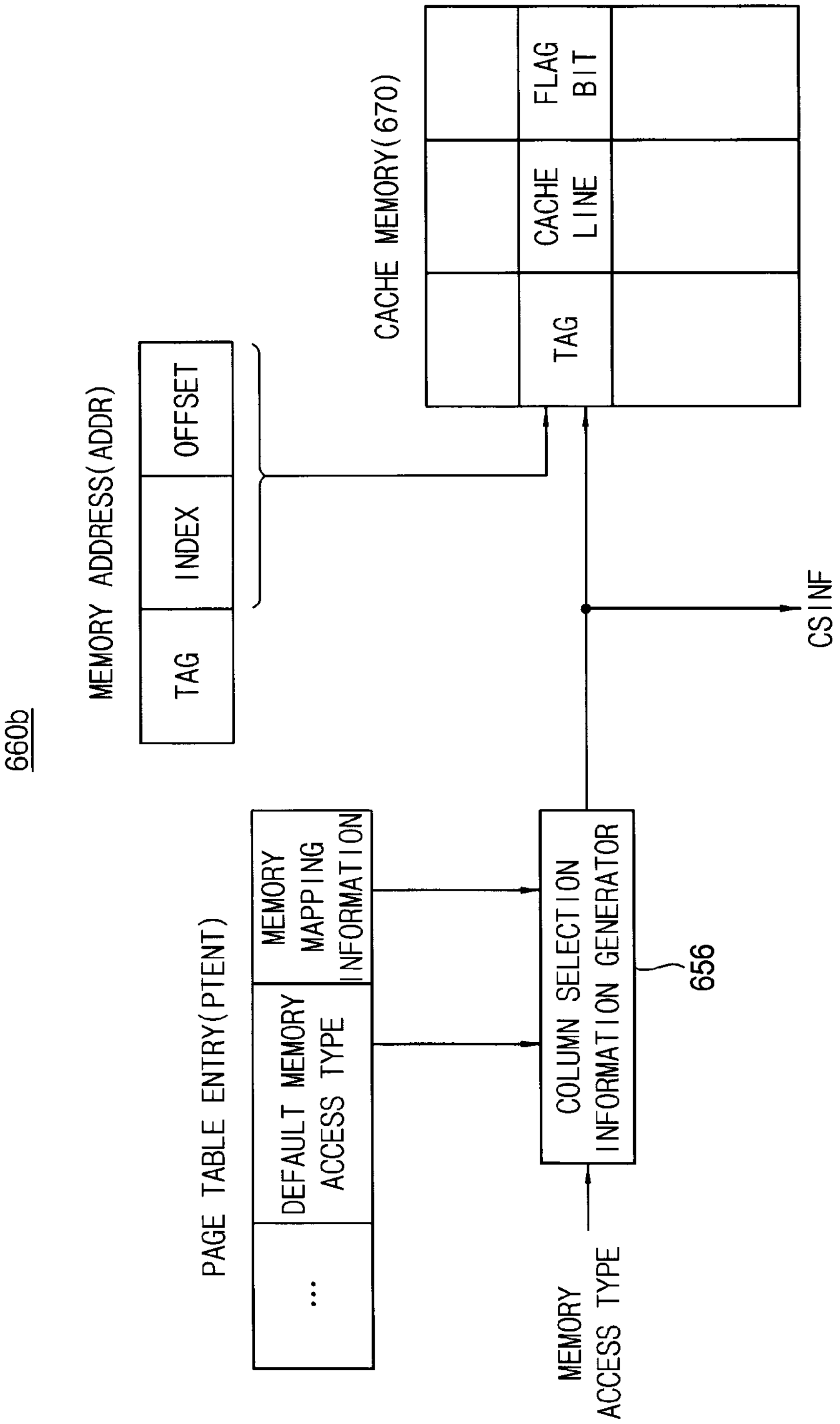
Figure 11C:
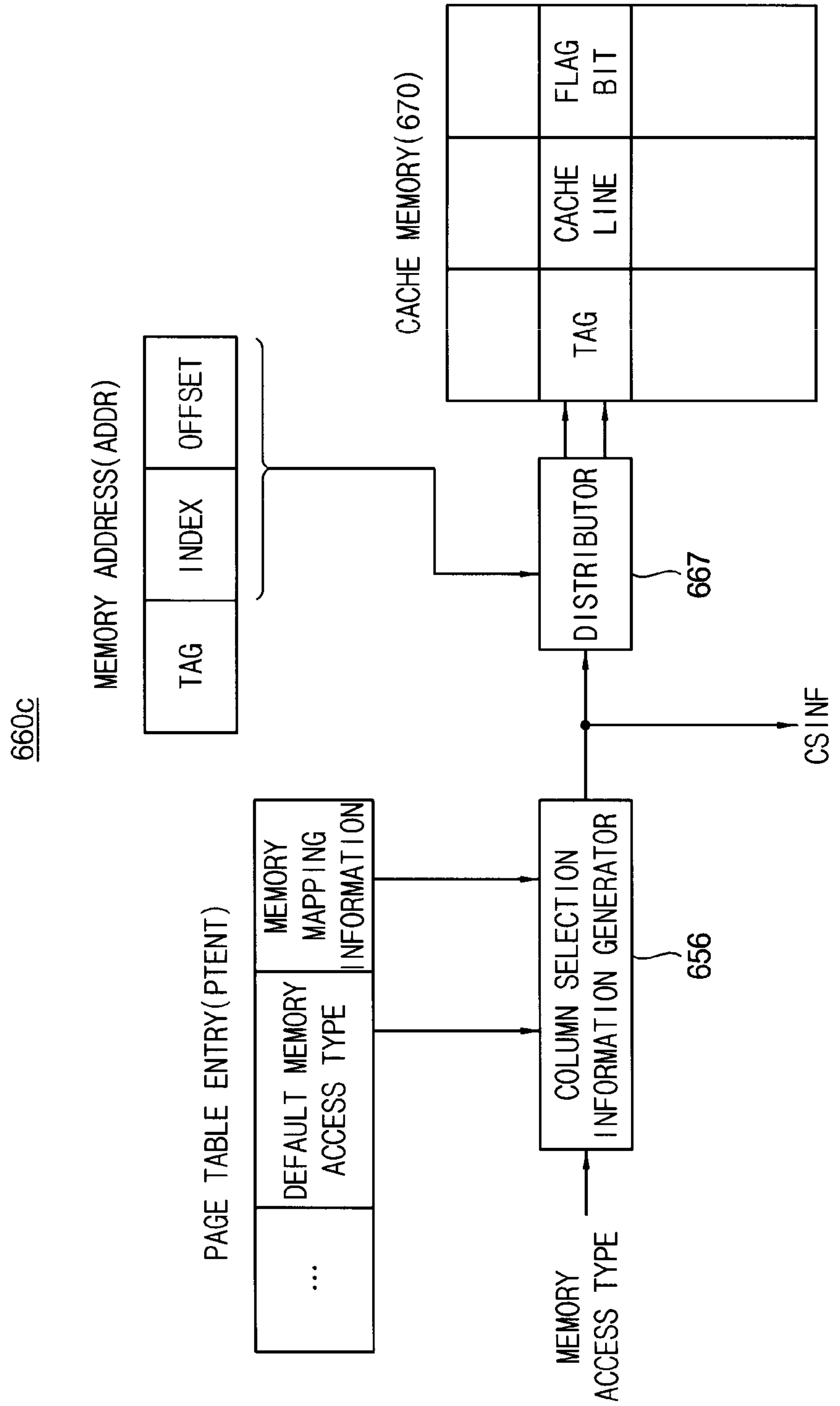

FIGS. 11A, 11B, and 11C are block diagrams illustrating examples of a cache controller included in the bus master of the electronic system shown in FIG. 9.

Referring to FIG. 11A, a cache controller 660*a* may include a first comparator 662*a*, a selector 665, a second comparator 662*b*, and a logic gate 664. The column selection information generator 656 and a page table entry PTENT shown together are included in the controller 650 of FIG. 9, and a cache entry CENT is included in the cache memory 670 of FIG. 9.

In the example embodiment of FIG. 11A, the cache controller 660*a* may increase an offset in an order of memory access types, and may store data in a cache line of the cache entry CENT. At this time, an applied memory access type may be stored in an auxiliary bit of the cache entry CENT so as to be used in cache hit determination, and the column selection information may also be stored in the auxiliary bit so as to be used at the time of write-back. Address translation according to the virtual memory mapping scheme required to access the main memory (e. g., 610 of FIG. 9) and the column selection information may be generated by the controller 650 of FIG. 9.

The first comparator 662*a* may compare a tag of a memory address ADDR with a tag stored in the cache entry CENT to generate a first comparison signal COMP1. For example, the first comparison signal COMP1 may be "1"

when the tag of the memory address ADDR matches with the tag of the cache entry CENT, and may be "0" when the tags do not match with each other.

The memory address ADDR may include a tag, an index, and an offset, and the cache entry CENT may include a tag, a cache line, a flag bit, and an auxiliary bit. For example, the memory address ADDR may correspond to the virtual address VADDR or the physical address PADDR shown in FIGS. 10A and 10B. In an example embodiment, the cache entry CENT may further include an auxiliary bit. The auxiliary bit may include the memory access type information DMAT and the column selection information CSINF.

The selector 665 may select the memory access type information DMAT if the memory access type information MAT is valid, and may select the default memory access type information DMAT if the memory access type information MAT is invalid.

The second comparator 662*b* may compare an output of the selector 665 with the auxiliary bit stored in the cache entry CENT to generate the second comparison signal COMP2. For example, the second comparison signal COMP2 may be "1" when a memory access type outputted from the selector 665 is the same as a memory access type stored in the auxiliary bit, and may be "0" when the memory access types are different from each other.

The logic gate 664 may generate a cache hit result signal HITR based on the first comparison signal COMP1, the second comparison signal COMP2, and validity of a valid bit VLD indicating that valid data is stored in the cache line among flag bits stored in the cache entry CENT. For example, the cache hit result signal HITR may be "1" representing a cache hit when the first comparison signal COMP1, the second comparison signal COMP2, and the valid bit VLD are all "1", otherwise, the cache hit result signal HIT may be "0" representing a cache miss.

When compared with a conventional cache controller, the auxiliary bit including the memory access type and the column selection information is used in example embodiments so that the cache controller 660*a* may further include the selector 665 and the second comparator 662*b*.

Referring to FIG. 11B, a configuration of a cache controller 660*b* may be similar to that of the cache controller 660*a* of FIG. 11A. However, the selector 665 and the second comparator 662*b* may be omitted because the auxiliary bit is unnecessary.

In the example of FIG. 11B, the example embodiments can be applied to the cache line of the cache memory 670. For example, a plurality of cache columns among cache columns included in the cache line may be selected and accessed based on the column selection information CSINF.

In an example embodiment, a size of the cache line may be designed to be equal to or multiple the line size of the main memory. In this case, multiple cache columns among the cache lines may be selectively accessed in the same manner as the main memory 610 according to the generated column selection information CSINF. Since the memory access type and column selection information CSINF are applied at the time of accessing the cache line, it is unnecessary to store the memory access type and column selection information CSINF for future use, and therefore no auxiliary bits are required.

Referring to FIG. 11C, a configuration of a cache controller 660*c* may be similar to the cache controller 660*b* of FIG. 11B. However, the cache controller 660*c* may further include a distributor 667.

The distributor 667 may distribute the column selection information CSINF outputted from the column selection information generator 656, and may supply the distributed column selection information CSINF to the cache memory 670 by increasing or decreasing an offset so as to match one of selected columns with the distributed column selection information CSINF. The target cache columns among the cache columns included in the cache memory 670 may be selected based on the distributed column selection information outputted from the distributor 667.

In the example of FIG. 11C, the line size of the main memory is a multiple of the cache line size. The column selection information CSINF may be equally divided corresponding to the multiple by the distributor 667, so that the cache line can be accessed several times while sequentially supplying the column selection information CSINF to the cache memory 670.

The present inventive concept can be applied to various devices and systems including a memory device. Therefore, the present inventive concept can be usefully used in various electronic devices such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a music player, a portable game console, a navigation device, a wearable device, an Internet of Things (IoT) device, a virtual reality (VR) device, an augmented reality (AR) device, an artificial intelligence device, etc.

Although the disclosure has been described with reference to some example embodiments thereof, it is understood that various changes and modifications can be made by those skilled in the art without departing from the spirit and scope of the present inventive concept as disclosed in the appended claims.

What is claimed is:

1. A memory device comprising:

a memory cell array including a plurality of memory cells arranged to form a plurality of rows and a plurality of columns;

a row decoder configured to generate a row selection signal based on a row address to select a target row from the plurality of rows;

a multi-column decoder configured to generate a multi-column selection signal based on a single column address and column selection information to select a plurality of target columns from columns included in the target row at a time;

a gating circuit configured to select the plurality of target columns at a time based on the multi-column selection signal; and an input/output data driving circuit configured to write input data to the plurality of target columns at a time or to output data stored in the plurality of target columns at a time as output data through the gating circuit based on the multi-column selection signal and a data mask signal, wherein column addresses corresponding to the plurality of target columns included in the target row are not consecutive, wherein the column selection information used for generating the multi-column selection signal does not include the column addresses corresponding to the plurality of target columns.

2. The memory device of claim 1, further comprising:

a line decoder configured to generate a line selection signal based on the column address to select one target line from a plurality of lines included in the target row based on the line selection signal, each of the plurality of lines including at least two columns; and a second gating circuit configured to select the one target line based on the line selection signal, wherein the plurality of target columns are included in the one target line.

3. The memory device of claim 1, wherein data stored in the target row includes data mapped in a tile scheme or a super tile scheme where $2^n$ tiles (n is a positive integer) are serially connected.

4. The memory device of claim 1, wherein the column selection information is set based on a predefined column selection mode, and an available combination of the plurality of target columns included in the target row matches with the column selection mode.

5. The memory device of claim 1, wherein data stored in the target row includes array data mapped in a tile scheme, the column selection information is set based on a column selection parameter, and the column selection parameter includes information of positions of two element data included in one tile, and the plurality of target columns correspond to elements in one side with respect to a virtual line that passes through the two element positions.

6. The memory device of claim 1, wherein data stored in the target row includes array data mapped in a tile scheme, the column selection information is set based on a column selection parameter, and the column selection parameter includes information of positions of two element data included in one tile, and the plurality of target columns correspond to elements within a virtual rectangle that has diagonal vertices at the two element positions.

7. The memory device of claim 1, wherein the column selection information is provided in a form of a column selection list that directly includes information on the plurality of target columns.

8. The memory device of claim 1, wherein the column selection information is set based on predefined column selection modes, and provided in a form of a column selection information list where the column selection modes are combined.

9. A memory device comprising:

a first memory device including a plurality of memory cells arranged to form a plurality of rows and a plurality of columns, configured to select a target row from the plurality of rows based on a row address, and configured to select a target line from a plurality of lines included in the target row based on a single column address, each of the plurality of lines including at least two columns;

a multi-column decoder configured to generate a multi-column selection signal based on the single column address and column selection information to select a plurality of target columns from columns included in the target line at a time;

a gating circuit configured to select the plurality of target columns in the target line at a time based on the multi-column selection signal; and an input/output data driving circuit configured to write input data to the plurality of target columns at a time or to output data stored in the plurality of target columns at a time as output data through the gating circuit based on the multi-column selection signal and a data mask signal, wherein column addresses corresponding to the plurality of target columns included in the target line are not consecutive, wherein the column selection information used for generating the multi-column selection signal does not include the column addresses corresponding to the plurality of target columns.

10. The memory device of claim 9, wherein data stored in the target row includes data mapped in a tile scheme or a super tile scheme where $2^n$ tiles (n is a positive integer) are serially connected.

11. The memory device of claim 9, wherein the column selection information is set based on a predefined column selection mode, and an available combination of the plurality of target columns included in the target row matches with the column selection mode.

12. The memory device of claim 9, wherein data stored in the target row includes array data mapped in a tile scheme, the column selection information is set based on a column selection parameter, and the column selection parameter includes information of positions of two element data included in one tile, and the plurality of target columns correspond to elements in one side with respect to a virtual line that passes through the two element positions.

13. The memory device of claim 9, wherein data stored in the target row includes array data mapped in a tile scheme, the column selection information is set based on a column selection parameter, and the column selection parameter includes information of positions of two element data included in one tile, and the plurality of target columns correspond to elements within a virtual rectangle that has diagonal vertices at the two element positions.

14. The memory device of claim 9, wherein the column selection information is provided in a form of a column selection list that directly includes information on the plurality of target columns.

15. The memory device of claim 9, wherein the column selection information is set based on predefined column selection modes, and provided in a form of a column selection information list where the column selection modes are combined.

16. An electronic system comprising:

a memory device including a plurality of memory cells arranged to form a plurality of rows and a plurality of columns, configured to generate a row selection signal based on a row address to select a target row from the plurality of rows, configured to generate a multi-column selection signal based on a single column address and column selection information to select a plurality of target columns from columns included in the target row at a time, configured to select the plurality of target columns at a time based on the multi-column selection signal, and configured to write input data to the plurality of target columns at a time or configured to output data stored in the plurality of target columns at a time as output data based on the multi-column selection signal and a data mask signal, in which column addresses corresponding to the plurality of target columns included in the target row are not consecutive; and a bus master connected to the memory device through a bus, and configured to generate the row address, the column address, and the column selection information provided to the memory device, wherein the bus master includes a controller including:

a memory management unit configured to generate the row address and the column address corresponding to a physical address based on a virtual address and memory mapping information; and a column selection information generator configured to generate the column selection information based on the memory mapping information, memory access type information, and default memory access type information, wherein the column selection information used for generating the multi-column selection signal does not include the column addresses corresponding to the plurality of target columns.

17. The electronic system of claim 16, wherein the memory mapping information and the default memory access type information are stored in a separate register or a page table.

18. The electronic system of claim 16, wherein the column selection information generator generates the column selection information based on the memory mapping information and the memory access type information when the memory access type information is valid, and generates the column selection information based on the memory mapping information and the default memory access type information when the memory access type information is invalid.

19. The electronic system of claim 16, wherein the bus master further includes:

a first comparator configured to compare a tag of the virtual address or the physical address with a tag stored in a cache entry to generate a first comparison signal;

a selector configured to select one of the memory access type information and the default memory access type information;

a second comparator configured to compare an output of the selector with memory access type information stored in an auxiliary bit of the cache entry to generate a second comparison signal;

a logic gate configured to generate a cache hit result signal based on validity of the first comparison signal, the second comparison signal, and a valid bit of a flag bit stored in the cache entry;

a cache controller configured to increase an offset in an order of memory access types, configured to store data in a cache line of the cache entry, and configured to store the memory access types and the column selection information in the auxiliary bit of the cache entry; and a cache memory controlled by the cache controller and including the auxiliary bit in the cache entry.

20. The electronic system of claim 16, wherein the bus master further includes:

a cache controller configured to access a plurality of target cache columns among a plurality of cache columns of a cache line at a time based on the column selection information; and a cache memory controlled by the cache controller, the cache memory configured to write the input data to the plurality of target cache columns at a time, or configured to output data stored in the plurality of target cache columns as the output data at a time.

21. The electronic system of claim 20, wherein the cache controller includes a distributor distributing the column selection information, and the plurality of target cache columns among the plurality of cache columns included in the cache line are accessed at a time based on the distributed column selection information outputted from the distributor.

* * * * *